United States Patent
Kang et al.

(10) Patent No.: US 11,417,262 B2
(45) Date of Patent: Aug. 16, 2022

(54) GATE DRIVING CIRCUIT INCLUDING A SHIFT REGISTER AND DISPLAY DEVICE INCLUDING THE SAME

(71) Applicant: Samsung Display Co., Ltd., Yongin-si (KR)

(72) Inventors: Keunoh Kang, Uijeongbu-si (KR); Yanguk Nam, Hwaseong-si (KR); Gwangsoo Ahn, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 52 days.

(21) Appl. No.: 16/997,642

(22) Filed: Aug. 19, 2020

(65) Prior Publication Data

US 2021/0158744 A1 May 27, 2021

(30) Foreign Application Priority Data

Nov. 21, 2019 (KR) .......................... 10-2019-0150301

(51) Int. Cl.
  *G09G 3/20* (2006.01)
  *G11C 19/28* (2006.01)
(52) U.S. Cl.
  CPC ........... *G09G 3/2092* (2013.01); *G11C 19/28* (2013.01); *G09G 2310/0286* (2013.01); *G09G 2330/021* (2013.01)
(58) Field of Classification Search
  CPC ............................................ G09G 2310/0286
  See application file for complete search history.

(56) References Cited

U.S. PATENT DOCUMENTS

| 7,317,779 | B2 | 1/2008 | Moon et al. | |
|---|---|---|---|---|
| 9,934,753 | B2 | 4/2018 | Nam et al. | |
| 10,431,140 | B2 | 10/2019 | Heo et al. | |
| 10,453,406 | B2 | 10/2019 | Jang et al. | |
| 2011/0273416 | A1* | 11/2011 | Bae ...................... | G09G 3/3677 345/211 |
| 2014/0307193 | A1 | 10/2014 | Park et al. | |
| 2016/0063962 | A1* | 3/2016 | Park ...................... | G09G 3/3611 345/211 |
| 2017/0249893 | A1* | 8/2017 | Kim ....................... | G11C 19/28 |
| 2018/0158432 | A1* | 6/2018 | Koo ...................... | G09G 3/3696 |

FOREIGN PATENT DOCUMENTS

| KR | 10-0917009 B1 | 9/2009 |
|---|---|---|
| KR | 10-2017-0039806 A | 4/2017 |
| KR | 10-2017-0039816 A | 4/2017 |
| KR | 10-2018-0078407 A | 7/2018 |

* cited by examiner

*Primary Examiner* — Chad M Dicke
(74) *Attorney, Agent, or Firm* — Lewis Roca Rothgerber Christie LLP

(57) ABSTRACT

A display device includes a display panel, a gate driving circuit including a plurality of stages, and a power supply circuit outputting a clock signal, a clock-bar signal, a first discharge voltage, and a second discharge voltage. Each of stages includes a charge part that charges a clock signal having a first high voltage to a charge node, an output part that charges the first high voltage to an output node in response to a first node voltage of the charge node and outputs a second node voltage of the output node to a gate signal, a first discharge part that discharges the second node voltage to a first discharge voltage in response to the clock-bar signal having a second high voltage, and a second discharge part that discharges the first node voltage to a second discharge voltage in response to the clock-bar signal having the second high voltage.

18 Claims, 18 Drawing Sheets

FIG. 9A

| P-CS | NC | SC |
|------|----|----|
| 0 | 0 | VS1 |
| 1 | 0 | VS1 |
| 0 | 1 | VS1 |
| 1 | 1 | VS2 |

GATE DRIVING CIRCUIT INCLUDING A SHIFT REGISTER AND DISPLAY DEVICE INCLUDING THE SAME

CROSS-REFERENCE TO RELATED APPLICATION

This application claims priority to and the benefit of Korean Patent Application No. 10-2019-0150301, filed on Nov. 21, 2019 in the Korean Intellectual Property Office (KIPO), the entire content of which is incorporated herein by reference.

BACKGROUND

1. Field

One or more embodiments of the present disclosure herein relates to a display device, and more particularly, to a gate driving circuit and a display device including the same.

2. Description of the Related Art

A display device includes a plurality of gate lines, a plurality of data lines, and a plurality of pixels connected to the plurality of gate lines and the plurality of data lines. The display device includes a gate driving circuit for providing gate signals to the gate lines and a data driving circuit for outputting data signals to the data lines.

The gate driving circuit includes a shift register including a plurality of driving stage circuits (hereinafter, referred to as driving stages). Each of the driving stages outputs the gate signal to the gate line. Each of the driving stages includes a plurality of transistors for outputting the gate signal.

SUMMARY

One or more aspects of example embodiments of the present disclosure are directed toward a gate driving circuit capable of improving driving reliability and a display device including the same.

An embodiment of the present disclosure provides a gate driving circuit including: a charge part connected to a charge node and configured to charge a clock signal having a first high voltage to the charge node during a first section; an output part connected to each of the charge node and an output node and configured to charge the first high voltage to the output node in response to a first node voltage of the charge node during the first section and output a second node voltage of the output node to a gate signal; a first discharge part configured to discharge the second node voltage to a first discharge voltage in response to a clock-bar signal having a second high voltage during a second section that is consecutive to the first section; and a second discharge part configured to discharge the first node voltage to a second discharge voltage during the second section. Here, the first section has one of a first sub-section, during which the second discharge part is turned-off, or a second sub-section, during which the second discharge part alternates between a first mode in which the second discharge part is turned-on and a second mode in which the second discharge part is turned-off.

In an embodiment, the second discharge part may receive the clock-bar signal having a first low voltage during the first section, and a first voltage level of the second discharge voltage may be lower than a second voltage level of the first low voltage in the first mode.

In an embodiment, the first voltage level of the second discharge voltage may be substantially the same as the second voltage level of the first low voltage during the first sub-section and in the second mode.

In an embodiment, the second discharge part may discharge the first node voltage to the second discharge voltage having the first voltage level in the first mode.

In an embodiment, the second discharge part may include a first discharge transistor configured to discharge the first node voltage to the second discharge voltage having the first voltage level in response to the first low voltage of the clock-bar signal during the second section.

In an embodiment, the first discharge part may include a second discharge transistor configured to discharge the second node voltage to the first discharge voltage in response to the first low voltage of the clock-bar signal during the second section.

In an embodiment, during the second sub-section, a voltage level of the second discharge voltage according to the first mode at a first time and a voltage level of the second discharge voltage according to the first mode at a second time may be different from each other.

In an embodiment, during the second sub-section, a voltage level of the second discharge voltage according to the first mode at a first time and a voltage level of the second discharge voltage according to the first mode at a second time may be substantially the same as each other.

In an embodiment, the first mode and the second mode may have time sections that are substantially the same in duration as each other.

In an embodiment, the first mode and the second mode may have time sections that are different in duration from each other, and a section according to the first mode may be longer than a section according to the second mode.

In an embodiment of the present disclosure, a display device includes: a display panel; a gate driving circuit including a plurality of stages configured to output a plurality of gate signals to the display panel, the plurality of stages comprising an i-stage where i is a natural number; a signal control circuit configured to output a power control signal; and a power supply circuit configured to output a clock signal, a clock-bar signal, a first discharge voltage, and a second discharge voltage to the gate driving circuit in response to the power control signal. Here, the i-stage of the stages includes: a charge part configured to charge the clock signal having a first high voltage to a charge node during a first section; an output part connected to the charge part through the charge node and configured to charge the first high voltage to an output node in response to a first node voltage of the charge node and output a second node voltage of the output node to an i-th gate signal of the gate signals; a first discharge part connected to the output part through the output node and configured to discharge the second node voltage to a first discharge voltage in response to the clock-bar signal having a second high voltage during a second section that is consecutive to the first section; and a second discharge part connected to the charge node and configured to discharge the first node voltage to a second discharge voltage during the second section. Also, the first section has one of a first sub-section, during which the second discharge part is turned-off, or a second sub-section, during which the second discharge part alternates between a first mode in which the second discharge part is turned-on and a second mode in which the second discharge part is turned-off.

In an embodiment, the display device may further include a temperature sensing unit configured to output a temperature control signal based on an external temperature, and the first section may have one of the first sub-section or the second sub-section in response to the temperature control signal.

In an embodiment, the power supply circuit may include: a power generation part configured to output the first discharge voltage and the second discharge voltage; a clock generation part configured to output the clock signal and the clock-bar signal; and a power control part configured to receive the second discharge voltage and control a voltage level of the second discharge voltage based on the external temperature.

In an embodiment, the power control part may include: a frame selection portion configured to output a selection signal in response to the temperature control signal and the power control signal; and a voltage adjustment portion configured to adjust the voltage level of the second discharge voltage in response to the selection signal.

In an embodiment, the second discharge part may receive a first low voltage of the clock-bar signal during the first section, and a first voltage level of the second discharge voltage may be lower than a second voltage level of the first low voltage in the first mode.

In an embodiment, the power control signal may include a first pulse signal corresponding to the first mode and a second pulse signal corresponding to the second mode, the first pulse signal and the second pulse signal being alternately repeated.

In an embodiment, the temperature control signal may include a first temperature signal, in which the external temperature is less than a reference temperature, and a second temperature signal, in which the external temperature is equal to or greater than the reference temperature, and the first section may correspond to the first sub-section according to the first temperature signal and correspond to the second sub-section according to the second temperature signal.

In an embodiment, the display device may further include a signal sensing unit configured to receive the gate signals outputted from the gate driving circuit and analyze the gate signals, and the signal sensing unit may transmit an analysis control signal, which is based on an analysis result of each of the gate signals, to the power supply circuit.

In an embodiment, the power supply circuit may control an operation of the second discharge part in response to the analysis control signal.

In an embodiment of the present disclosure, a display device includes: a display panel; a gate driving circuit including a plurality of stages configured to output a plurality of gate signals to the display panel, the plurality of stages comprising an i-stage where i is a natural number; and a power supply circuit configured to output a clock signal, a clock-bar signal, a first discharge voltage, and a second discharge voltage to the gate driving circuit. Here, the i-stage of the stages includes: a charge part configured to charge the clock signal having a first high voltage to a charge node; an output part connected to the charge part through the charge node and configured to charge the first high voltage to an output node in response to a first node voltage of the charge node and output a second node voltage of the output node to an i-th gate signal of the gate signals; a first discharge part connected to the output part through the output node and configured to discharge the second node voltage to a first discharge voltage in response to the clock-bar signal having a second high voltage; and a second discharge part connected to the charge node and configured to discharge the first node voltage to the second discharge voltage in response to the clock-bar signal having the second high voltage. Also, the second discharge part may alternate between a first mode, which discharges the first node voltage to the second discharge voltage in response to the clock-bar signal, and a second mode, which maintains the first node voltage.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain principles of the present disclosure. In the drawings:

FIG. 9A is a table showing an operation of a frame selection part in FIG. 8 according to an embodiment of the present disclosure;

DETAILED DESCRIPTION

Figure 1:
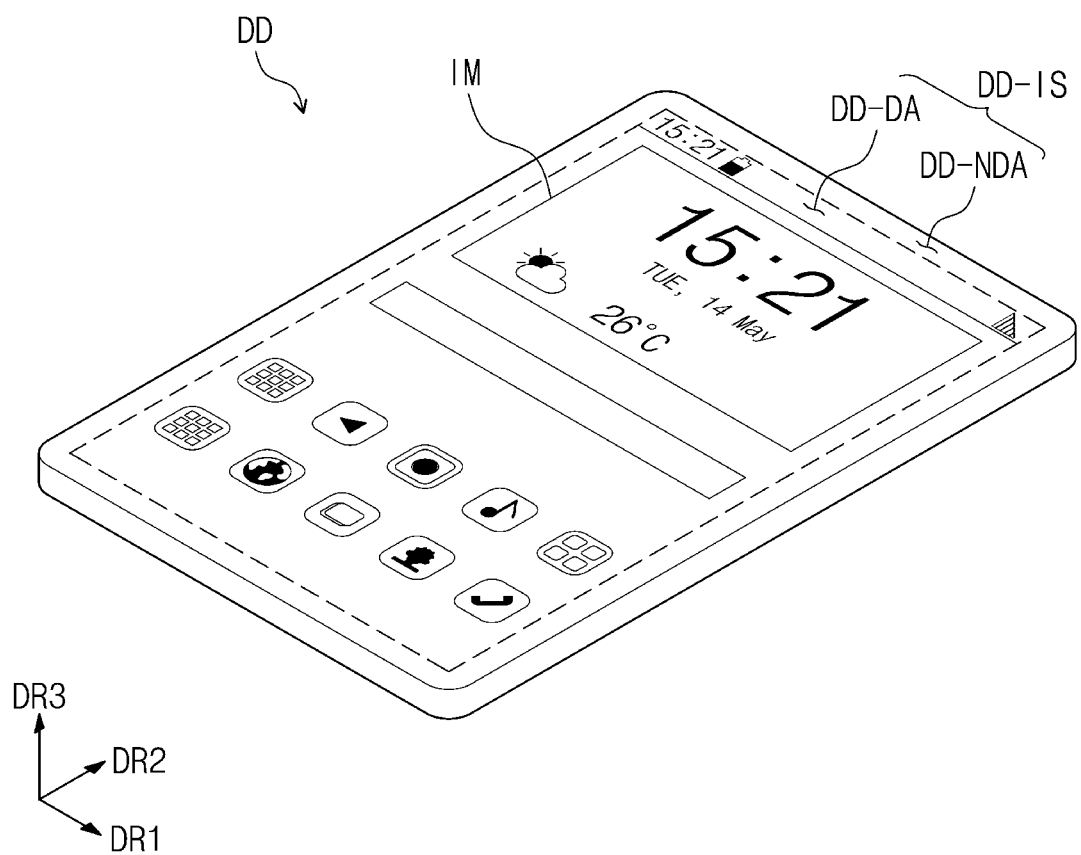
FIG. 1 is a perspective view illustrating a display device according to an embodiment of the present disclosure.

In this specification, it will also be understood that when one component (or region, layer, portion) is referred to as being cony, 'connected to', or 'coupled to' another component, it can be directly disposed/connected/coupled on/to the one component, or an intervening third component may also be present.

Like reference numerals refer to like elements throughout. Also, in the figures, the thickness, ratio, and dimensions of components are exaggerated for clarity of illustration.

As used herein, the singular forms "a," "an," and "the" are intended to include the plural forms as well, unless the context clearly indicates otherwise.

Further, the use of "may" when describing embodiments of the present disclosure refers to "one or more embodiments of the present disclosure".

As used herein, the terms "substantially", "about", and similar terms are used as terms of approximation and not as terms of degree, and are intended to account for the inherent deviations in measured or calculated values that would be recognized by those of ordinary skill in the art.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

As used herein, the terms "use," "using," and "used" may be considered synonymous with the terms "utilize," "utilizing," and "utilized," respectively.

As used herein, expressions such as "at least one of", "one of", and "selected from", when preceding a list of elements, modify the entire list of elements and do not modify the individual elements of the list.

The term "and/or" includes any and all combinations of one or more of the associated listed items.

It will be understood that although the terms such as 'first' and 'second' are used herein to describe various elements, these elements should not be limited by these terms. The terms are only used to distinguish one component from other components. For example, a first element referred to as a first element in one embodiment can be referred to as a second element in another embodiment without departing from the scope of the appended claims. The terms of a singular form may include plural forms unless referred to the contrary.

Also, "under", "below", "above", "upper", and the like are used for explaining relation association of components illustrated in the drawings. The terms may be a relative concept and described based on directions expressed in the drawings.

Unless otherwise defined, all terms (including technical and scientific terms) used herein have the same meaning as generally understood by those skilled in the art. Terms as defined in a commonly used dictionary should be construed as having the same meaning as in an associated technical context, and unless defined apparently in the description, the terms are not ideally or excessively construed as having formal meaning.

The meaning of 'include' or 'comprise' specifies a property, a fixed number, a step, an operation, an element, a component or a combination thereof, but does not exclude other properties, fixed numbers, steps, operations, elements, components or combinations thereof.

Hereinafter, embodiments of the present disclosure will be described with reference to the accompanying drawings.

Figure 2:
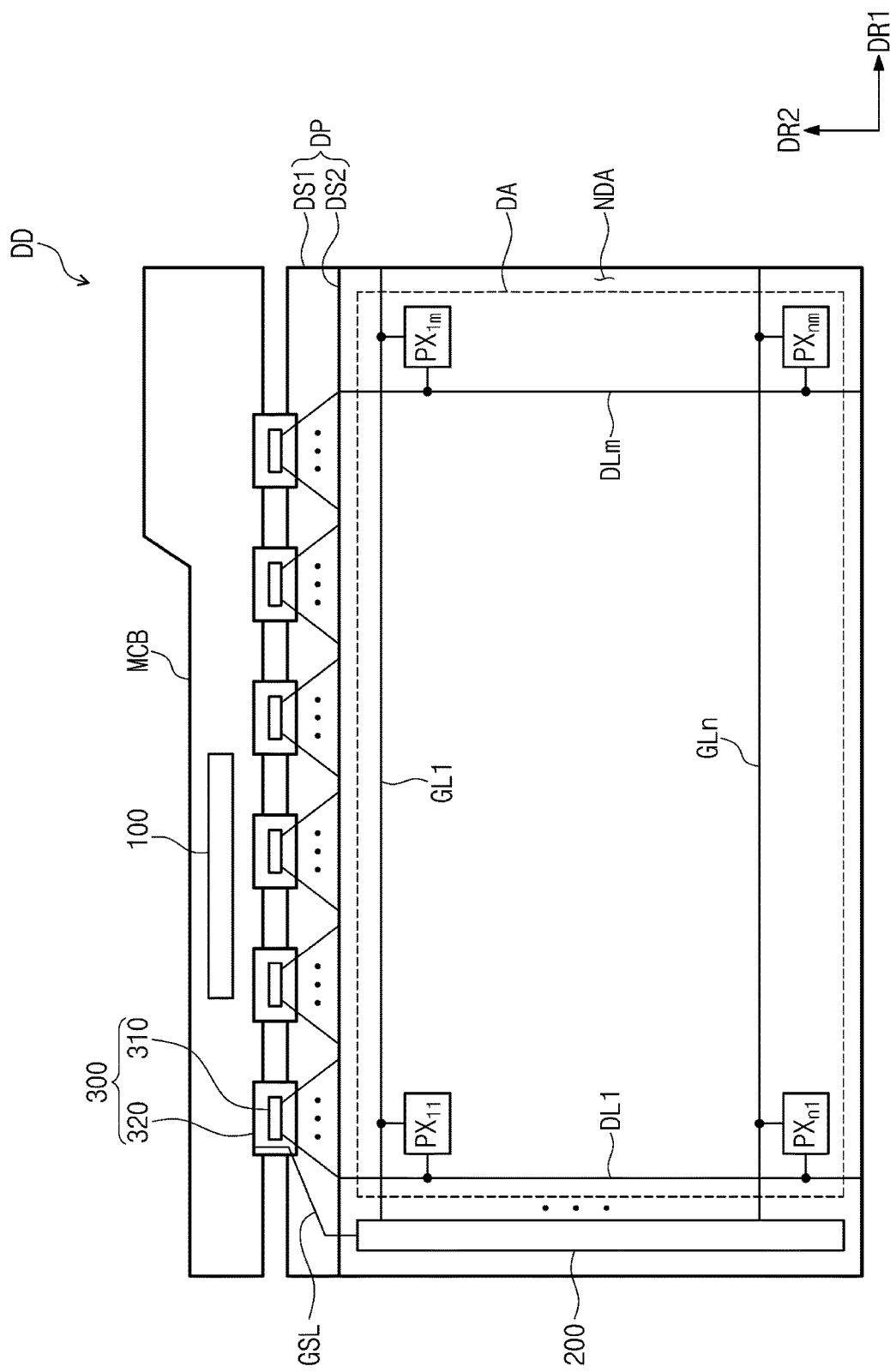
FIG. 2 is a plan view illustrating the display device according to an embodiment of the present disclosure.

FIG. 1 is a perspective view illustrating a display device according to an embodiment of the present disclosure. FIG. 2 is a plan view illustrating the display device according to an embodiment of the present disclosure.

In one or more embodiments, a display device DD that is applicable to a mobile phone terminal is exemplarily illustrated. In one or more embodiments, the mobile phone terminal may be provided as electronic modules mounted on a main board, a camera module, and a power module on a bracket/a case in conjunction with the display device DD. The display device DD according to an embodiment of the present disclosure may be used for large-sized electronic devices such as televisions and monitors and small and medium-sized electronic devices such as tablet PCs, navigation units for vehicles, game consoles, and smart watches.

As illustrated in FIG. 1, the display device DD may display an image IM through a display surface DD-IS (e.g., a display area DD-DA of the display surface DD-IS). FIG. 1 illustrates icon images as an example of the image IM. The display surface DD-IS is parallel to a surface or plane defined by a first direction DR1 and a second direction DR2. A normal direction of the display surface DD-IS (i.e., a thickness direction of the display device DD) refers to a third direction DR3. As used herein, the expression "plan view" may refer to a feature being viewed in a third direction DR3. Hereinafter, a front surface (or top surface) and a rear surface (or bottom surface) of each of layers or units are distinguished by the third direction DR3. However, directions indicated by the first, the second, and the third directions (e.g., DR1, DR2, and DR3 respectively) may be a relative to each other and may change with respect to each other.

Also, the display surface DD-IS includes a display area DD-DA on which an image IM is displayed and a non-display area DD-NDA disposed adjacent to the display area DD-DA. The non-display area DD-NDA may be an area on (or through) which an image is not displayed. In one or more embodiments, the non-display area DD-NDA surrounds the display area DD-DA. However, one or more embodiments of the present disclosure are not limited thereto. For example, the non-display area DD-NDA may be adjacent to one side of the display area DA, and, in one or more embodiments, the non-display area DD-NDA may be omitted.

Referring to FIG. 2, the display device DD includes a display panel DP, a signal control circuit 100, a gate driving circuit 200, a data driving circuit 300, and a driving circuit board MCB.

Although the display panel DP according to an embodiment of the present disclosure may be a light emitting display panel, one or more embodiments of the present disclosure are not limited thereto. For example, the display panel DP may be an organic light emitting display panel and a quantum-dot light emitting display panel. The organic light emitting display panel may include a light emitting layer containing an organic light emitting material. The quantum dot light emitting display panel may include a light emitting layer containing a quantum dot and a quantum rod. For example, the display panel DP may be a liquid crystal display panel. The liquid crystal display panel may include a liquid crystal layer and display an image by using external light.

The display panel DP includes a first substrate DS1 and a second substrate DS2, which face each other in the third direction DR3. Also, the display panel DP includes a display area DA for displaying an image and a non-display area NDA adjacent to the display area DA. The display area DA and the non-display area NDA of the display panel DP may correspond to the display area DP-DA and the non-display area DP-NDA of the display device DD in FIG. 1, respectively.

The display panel DP includes a plurality of gate lines GL1 to GLn, a plurality of data lines DL1 to DLm, and a plurality of pixels $PX_{11}$ to $PX_{nm}$. The gate lines GL1 to GLn each extend in the first direction DR1 and are arranged in the second direction DR2. The data lines DL1 to DLm each extend in the second direction DR2 and are arranged in the first direction DR1. The data lines DL1 to DLm cross the gate lines SL1 to SLn in an insulating manner. The gate lines GL1 to GLn are connected to the gate driving circuit 200, and the data lines DL1 to DLm are connected to the data driving circuit 300. The pixels $PX_{11}$ to $PX_{nm}$ are connected to the gate lines GL1 to GLn and the data lines DL1 to DLm.

In one or more embodiments, the plurality of gate lines GL1 to GLn, the plurality of data lines DL1 to DLm, and the plurality of pixels $PX_{11}$ to $PX_{nm}$ may be disposed on the first substrate DS1.

The signal control circuit 100 may be mounted on the driving circuit board MCB. The signal control circuit 100 receives image data and a control signal from an external graphic control unit. The signal control circuit 100 outputs a gate control signal to the gate driving circuit 200 and a data control signal to the data driving circuit 300 in response to the control signal.

For example, the control signal may include a vertical synchronization signal that is a signal for discriminating frame sections adjacent to each other, a horizontal synchronization signal that is a signal for discriminating horizontal sections (i.e., a row discrimination signal), a data enable signal having a high level during only a period for which data is outputted to display a data input section, and clock signals.

The gate driving circuit 200 generates gate signals based on the gate control signal received from the signal control circuit 100 through a signal line GSL. The gate control signal may include a vertical initiation signal that initiates an operation of the gate driving circuit 200. The gate driving circuit 200 outputs the gate signals to respective gate lines. The gate signals may be sequentially outputted in correspondence to the respective horizontal sections.

According to an embodiment of the present disclosure, the gate driving circuit 200 may be concurrently (e.g., simultaneously) provided with the pixels $PX_{11}$ to $PX_{nm}$ through a thin-film process. For example, the gate driving circuit 200 may be mounted in the form of an amorphous silicon TFT gate driver circuit (ASG) on the first substrate DS1 to overlap the non-display area NDA. As another example, the gate driving circuit 200 may be mounted in the form of an oxide semiconductor TFT gate driver circuit (OSG) on the first substrate DS1 to overlap the non-display area NDA.

However, one or more embodiments of the present disclosure are not limited thereto. For example, the display device DD may include two gate driving circuits. One of the two gate driving circuits may be connected to left ends of the plurality of gate lines GL1 to GLn, and the other one of the two gate driving circuits may be connected to right ends of the plurality of gate lines GL1 to GLn. Also, one of the two gate driving circuits may be connected to odd-numbered gate lines, and the other one of the two gate driving circuits may be connected to even-numbered gate lines.

The data driving circuit 300 receives a data control signal and image signals from the signal control circuit 100. The data driving circuit 300 converts the image signals into a plurality of data voltages and provides the converted data voltages to the data lines DL1 to DLm in response to the data control signal. For example, the data control signal may include a horizontal initiation signal that initiates an operation of the data driving circuit 300, a reversal signal that reverses polarities of the data voltages, and an output command signal that determines a time for outputting the data voltages from the data driving circuit 300.

The data driving circuit 300 may include a driving chip 310 and a flexible circuit board 320 on which the driving chip 310 is mounted. The flexible circuit board 320 connects (e.g., electrically connects) the driving circuit board MCB and the first substrate DS1. The plurality of driving chips 310 provide corresponding data signals to corresponding data lines of the plurality of data lines DL1 to DLm.

Although a tape carrier package (TCP)-type data driving circuit 300 is exemplarily illustrated in FIG. 2, one or more embodiments of the present disclosure are not limited thereto. For example, a chip on glass (COF)-type data driving chip 300 may be mounted on the non-display area NDA of the first substrate DS1.

Figure 3:
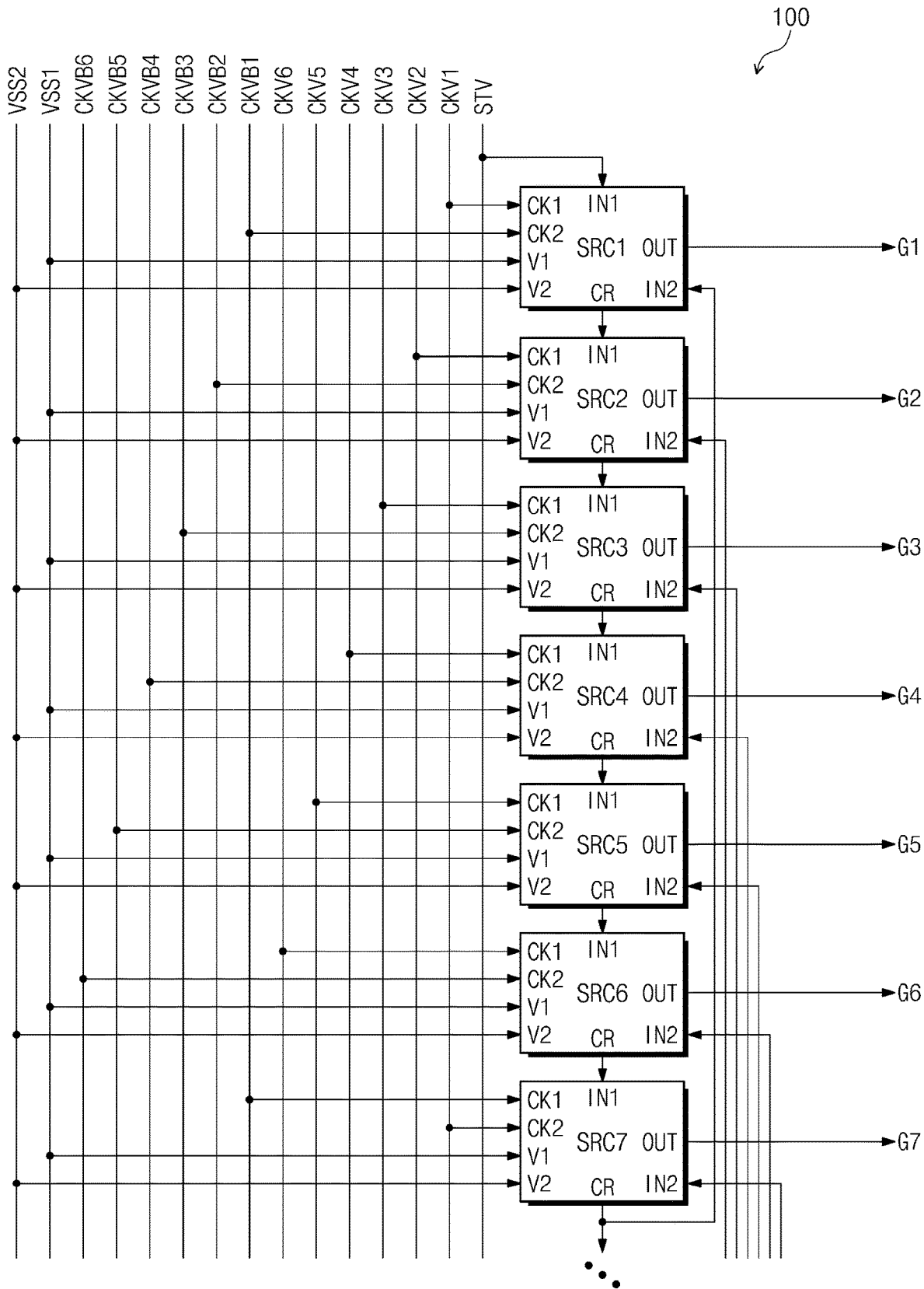
FIG. 3 is a block diagram showing a gate driving circuit according to an embodiment of the present disclosure.
Figure 4:
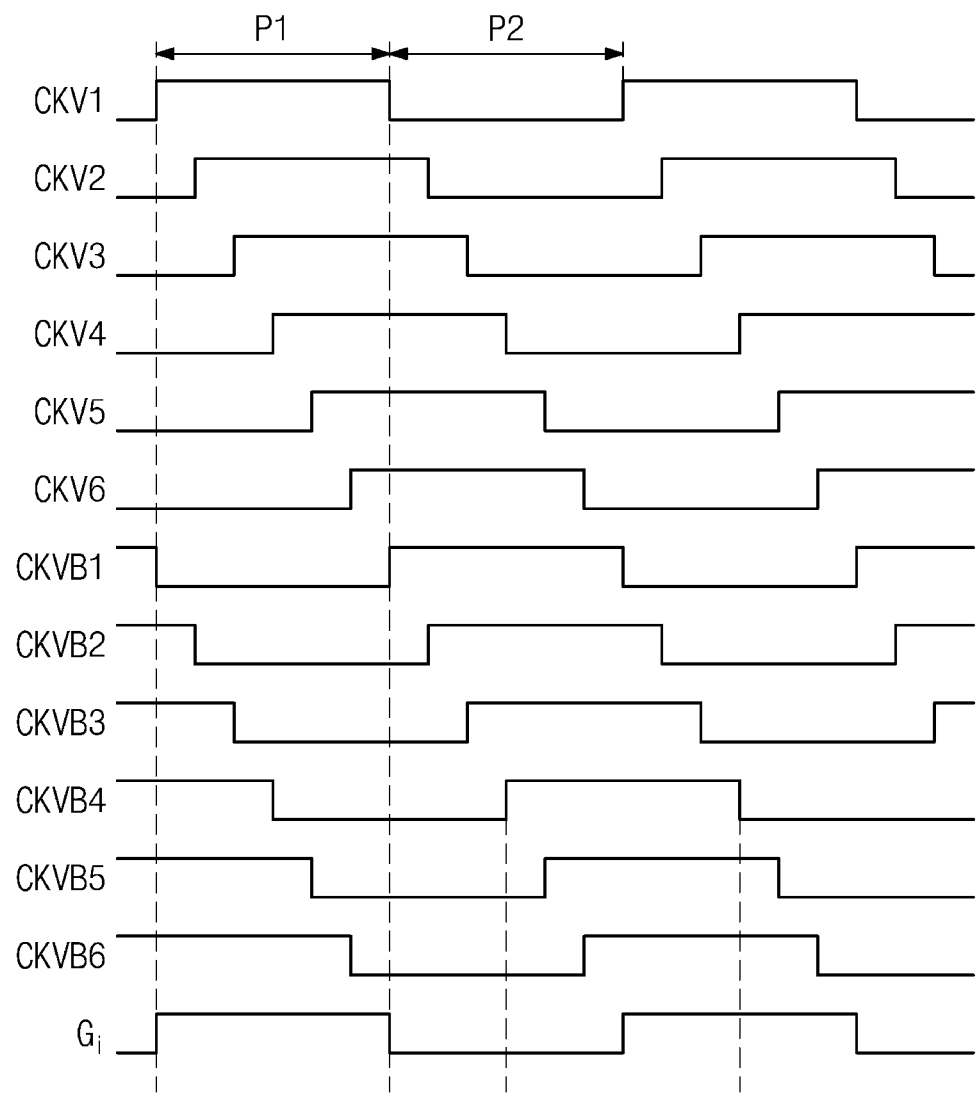
FIG. 4 is a timing diagram showing an operation of a stage in FIG. 3.

FIG. 3 is a block diagram showing a gate driving circuit according to an embodiment of the present disclosure. FIG. 4 is a timing diagram showing an operation of a stage in FIG. 3.

The gate driving circuit 200 may include a plurality of stages that are dependently connected to each other. The plurality of stages may include driving stages and dummy stages. The driving stages may be connected to the gate lines GL1 to GLn in FIG. 1, respectively. The plurality of driving stages may output gate signals to the gate lines GL1 to GLn, respectively.

Hereinafter, first to seventh stages SRC1 to SRC7 (the first stage SRC1, the second stage SRC2, the third stage SRC3, the fourth stage SRC4, the fifth stage SRC5, the sixth stage SRC6, and the seventh stage SRC7) corresponding to the driving stages of the plurality of stages are exemplarily illustrated in FIG. 3. Although the first to seventh stages SRC1 to SRC7 are exemplarily illustrated, driving stages and dummy stages may have the substantially same structure as illustrated in FIG. 3.

Each of the first to seventh stages SRC1 to SRC7 (hereinafter, referred to as 'stages') includes a first input terminal IN1, a second input terminal IN2, a first clock terminal CK1, a first discharge terminal V1, a second discharge terminal V2, an output terminal OUT, and a carry terminal CR.

The carry terminal CR of each of the stages SRC1 to SRC7 is connected (e.g., electrically connected) to the first input terminal IN1 of the following stage. An i-th stage may output an i-th carry signal through the carry terminal CR. Here, i is a natural number. The first input terminal IN1 of the first stage SRC1 receives a vertical initiation signal STV, which initiates driving of the gate driving circuit 200 outputted from the signal control circuit 100, instead of a carry signal of the previous stage. The first input terminal IN1 of each of the stages SRC2 to SRC7 after the first stage SRC1 receives a carry signal of the previous stage. The first input terminal IN1 of the i-th stage is connected (e.g., electrically connected) to the carry terminal CR of an i−1-th stage. The first input terminals IN1 of the second stage SRC2 and the third stage SRC3 receive carry signals of the first stage SRC1 and the second stage SRC2, respectively.

However, one or more embodiments of the present disclosure are not limited thereto. For example, the first input terminal IN1 of the i-th stage may be connected (e.g., electrically connected) to the carry terminal of any suitable previous stage (e.g., the i−1-th stage, an i−2-th stage, or an i−3-th stage).

The second input terminal IN2 of the i−1-th stage is connected (e.g., electrically connected) to the carry terminal CR of an i+6-th stage and receives a carry signal of the i+6-th stage. For example, the second input terminal IN2 of the first stage SRC1 receives a carry signal of the seventh stage SRC7, and the second input terminal IN2 of the second stage SRC2 receives a carry signal of the eighth stage.

At least one driving stage of the stages may receive the carry signal through the dummy stage. That is, the second input terminal IN2 of the at least one driving stage may receive the carry signal outputted from the dummy stage. The dummy stages are sequentially connected from a rear end of a last driving stage of the driving stages. However, the number and positions of the dummy stages in one or more embodiments may be suitably varied according to the design purpose.

The first clock terminal CK1 and the second clock terminal CK2 of the i-th stage may receive signals having phases reversed from each other, respectively. That is, the first clock terminal CK1 of the first stage SRC1 may receive a clock signal having a high voltage, and the second clock terminal CK2 may receive a low voltage clock-bar signal.

In more detail, referring to FIGS. 3 and 4, a first section P1 is a section in which each of clock signals CKV1 to CKV6 (clock signals CKV1, CKV2, CKV3, CKV4, CKV5, and CKV6) is a high voltage, and a second section P2 is a section in which each of the clock signals CKV1 to CKV6 is a low voltage Also, the first section P1 may be a section in which each of clock-bar signals CKVB1 to CKVB6 (clock-bar signals CKVB1, CKVB2, CKVB3, CKVB4, CKVB5, and CKVB6) is a low voltage, and the second section P2 may be a section in which each of clock-bar signals CKVB1 to CKVB6 is a high voltage.

According to an embodiment of the present disclosure, the first to sixth stages SRC1 to SRC6 may sequentially output first to sixth gate signals G1 to G6 (a first gate signal G1, a second gate signal G2, a third gate signal G3, a fourth gate signal G4, a fifth gate signal G5, and a sixth gate signal G6) in response to the first to sixth clock signals CKV1 to CKV6. Thereafter, seventh to twelfth stages may sequentially output seventh to twelfth gate signals in response to the first to sixth clock-bar signals CKVB1 to CKVB6. The above-described operation method may be repeatedly performed.

First, an operation method of the first to sixth stages SRC1 to SRC6 will be described.

During the first section P1, the first clock terminal CK1 of the first stage SRC1 receives a first high voltage of the first clock signal CKV1, and the second clock terminal CK2 of the first stage SRC1 receives a second low voltage of the first clock-bar signal CKVB1. The output terminal OUT of the first stage SRC1 may output the first gate signal G1 during the first section P1 in response to the first high voltage of the first clock signal CKV1. A phase difference between the first clock signal CKV1 and the first clock-bar signal CKVB1 may be about 180°.

During the first section P1, the first clock terminal CK1 of the second stage SRC2 receives a first high voltage of the second clock signal CKV2, and the second clock terminal CK2 of the second stage SRC2 receives a second low voltage of the first clock-bar signal CKVB1. The output terminal OUT of the second stage SRC2 may output the second gate signal G2 during the first section P1 in response to the first high voltage of the second clock signal CKV2. A phase difference between the second clock signal CKV2 and the second clock-bar signal CKVB2 may be about 180°.

During the first section P1, the first clock terminal CK1 of the third stage SRC3 receives a first high voltage of the third clock signal CKV3, and the second clock terminal CK2 of the third stage SRC3 receives a second low voltage of the third clock-bar signal CKVB1. The output terminal OUT of the third stage SRC3 may output the third gate signal G3 during the first section P1 in response to the first high voltage of the third clock signal CKV3. A phase difference between the third clock signal CKV3 and the third clock-bar signal CKVB3 may be about 180°.

As described above, each of the fourth to sixth stages SRC4 to SRC6 may sequentially output fourth to sixth gate signals G4 to G6 in response to a first high voltage of each of the fourth to sixth clock signals CKV4 to CKV6.

Also, according to an embodiment of the present disclosure, first high voltage sections of the first to sixth clock signals CKV1 to CKV6 may overlap (e.g., overlap in time with) each other. In other words, one or more of the first to sixth clock signals CKV1 to CKV6 may be at a high level (high signal level) at the same time (e.g., during the first section P1 as shown in FIG. 4). For example, the first high voltage section of the sixth clock signal CKV6 may overlap first high voltage sections of the first to fifth clock signals CKV1 to CKV5. In the same manner, second low voltage sections of the first to sixth clock-bar signals CKVB1 to CKVB6 may overlap (e.g., overlap in time with) each other. In other words, one or more of the first to sixth clock-bar signals CKVB1 to CKVB6 may be at a low level (low signal level) at the same time (e.g., during the first section P1 as shown in FIG. 4). For example, the second low voltage section of the sixth clock-bar signal CKVB6 may overlap first low voltage sections of the first to fifth clock-bar signals CKVB1 to CKVB5.

Hereinafter, an operation method of the seventh to twelfth stages will be described. Each of the seventh to twelfth stages may output seventh to twelfth gate signals in response to second high voltages of the first to sixth clock-bar signals CKVB1 to CKVB6.

In more detail, during the second section P2, the first clock terminal CK1 of the seventh stage SRC7 receives the second high voltage of the first clock-bar signal CKVB1, and the second clock terminal CK2 of the seventh stage SRC7 receives the first low voltage of the first clock signal CKV1. The output terminal OUT of the seventh stage SRC7 may output the seventh gate signal G7 during the second section P2 in response to the second high voltage of the first clock-bar signal CKVB1. The carry signal outputted from the carry terminal CR of the seventh stage SRC7 may be received through the second input terminal IN2 of the first stage SRC1.

In one or more embodiments, during the second section P2, each of the eighth to twelfth stages may output eighth to twelfth gate signals in response to second high voltages of the second to sixth clock-bar signals CKVB1 to CKVB6.

Also, a first discharge voltage VSS1 may be outputted to the first discharge terminal V1 of each of the stages SRC1 to SRC7, and a second discharge voltage VSS2 may be outputted to the second discharge terminal V2 of each of the stages SRC1 to SRC7. For example, each of the first discharge voltage VSS1 and the second discharge voltage VSS2 may have a level equal to or less than a ground voltage.

For example, the first discharge voltage VSS1 may have a voltage level greater than that of the second discharge voltage VSS2. The first discharge voltage VSS1 may be set in a range from about −10V to about −5V, and the second discharge voltage VSS2 may be set in a range from about −16V to about −10V. In one or more embodiments, the first discharge voltage VSS1 and the second discharge voltage VSS2 may have the substantially same voltage level as each other.

Figure 5:
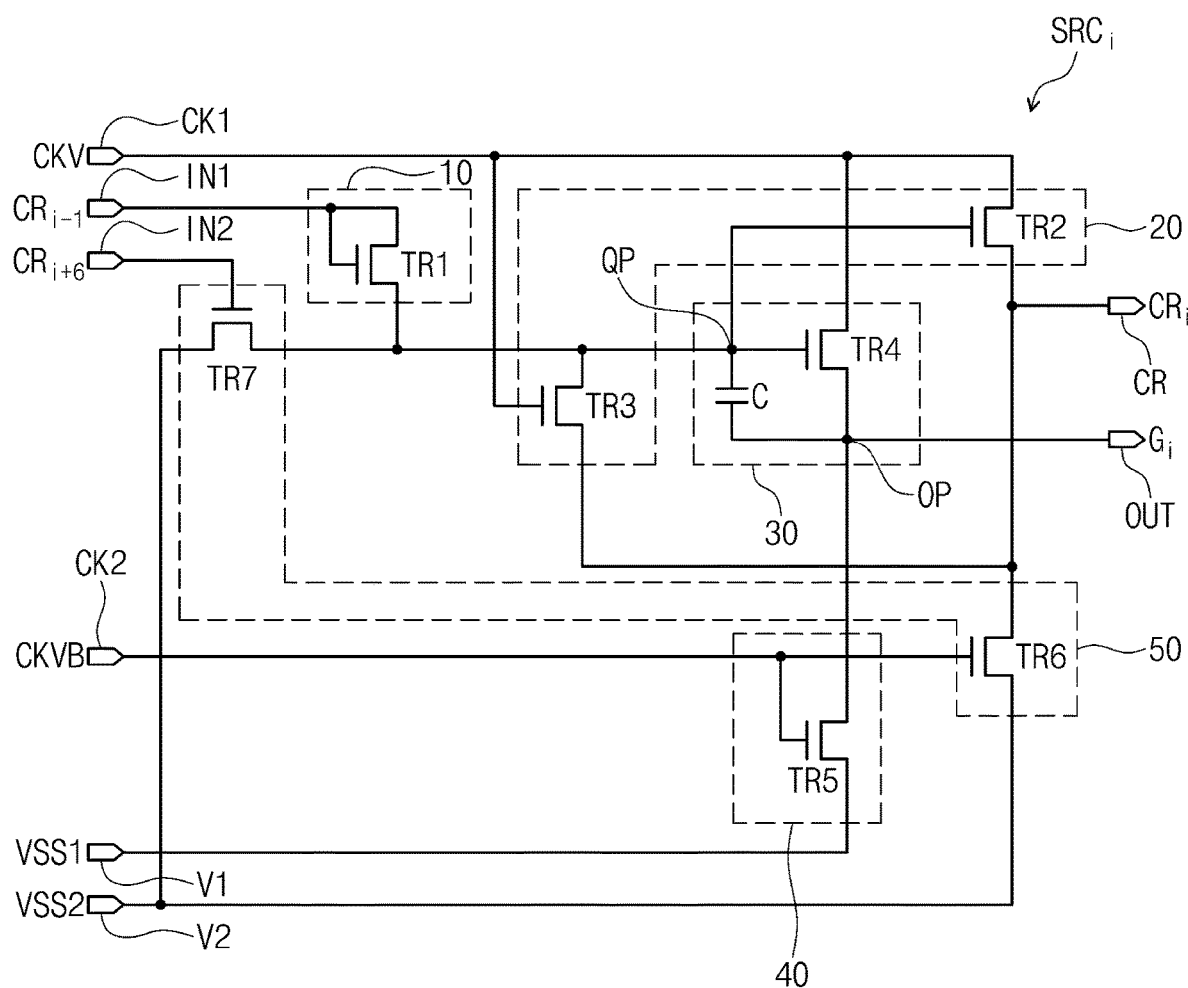
FIG. 5 is a circuit diagram showing a stage according to an embodiment of the present disclosure.

FIG. 5 is a circuit diagram showing the stage according to an embodiment of the present disclosure.

The stage SRCi in FIG. 5 is one of the stages according to an embodiment of the present disclosure.

Referring to FIG. 5, the stage SRCi includes a pre-charge part 10, a charge part 20, an output part 30, a first discharge part 40, and a second discharge part 50.

The pre-charge part 10 may increase a voltage level of a charge node QP in advance. That is, the pre-charge part 10 may receive a carry signal before the clock signal CKV is received through the first clock terminal CK1. For example, in case of the i-th stage, an i−1-th carry signal may be received through the first input terminal IN1.

The pre-charge part 10 includes a first transistor TR1 and is connected (e.g., electrically connected) to the first input terminal IN1. The first transistor TR1 includes a control electrode and a first electrode, which are connected to the first input terminal IN1, and a second electrode connected to the first electrode at the charge node QP. The voltage level of the charge node QP may be increased in response to the carry signal received through the first input terminal IN1. As a result, a voltage may be charged to a capacitor C.

The charge part 20 may charge the voltage of the charge node QP based on a voltage received from the first clock terminal CK1. As the charge part 20 increases the voltage level of the charge node QP, a gate signal Gi may be outputted from the output part 30.

The charge part 20 includes a second transistor TR2 and a third transistor TR3. The second transistor TR2 includes a control electrode connected to the charge node QP, a first electrode connected to the first clock terminal CK1, and a second electrode connected to the carry terminal CR from which the carry signal $CR_i$ is outputted. The third transistor TR3 includes a control electrode connected to the first clock terminal CK1, a first electrode connected to the charge node QP, and a second electrode connected to the carry output terminal.

The second transistor TR2 transmits the clock signal CKV having the high voltage, which is received through the first clock terminal CK1, to the third transistor TR3 in response to the first node voltage of the charge node QP. The third transistor TR3 transmits the clock signal CKV having the high voltage, which is transmitted from the second transistor TR2, to the charge node QP in response to the clock signal CKV having the high voltage. As a result, a first node voltage level of the charge node QP may be increased.

The output part 30 may transmit the clock signal CKV having the high voltage to the output node OP in response to the first node voltage level of the charge node QP. The output part 30 includes the fourth transistor TR4, and the fourth transistor TR4 includes a control electrode connected to the charge node QP, a first electrode connected to the first clock terminal CK1, and a second electrode connected to the output node OP. The output node OP is connected (e.g., electrically connected) to the output terminal OUT.

According to an embodiment, the first node voltage level of the charge node QP may be boosted by a voltage charged to the capacitor C and a high voltage of the clock signal CKV transmitted through the third transistor TR3. The boosted voltage level of the charge node QP may be transmitted to the control electrode of the fourth transistor TR4. The fourth transistor TR4 outputs the gate signal Gi, which corresponds to the high voltage of the clock signal CKV, to the output terminal OUT through the output node OP.

Thereafter, when the high voltage of the clock signal CKV is shifted to the low voltage, the first discharge part 40 and the second discharge part 50 may discharge a first node voltage level of the charge node QP and a second node voltage level of the output node OP.

The first discharge part 40 includes a fifth transistor TR5. In one or more embodiments, the fifth transistor TR5 may be a discharge transistor. The fifth transistor TR5 includes a control electrode connected to the second clock terminal CK2, a first electrode connected to the output node OP, and a second electrode connected to the first discharge terminal V1. The fifth transistor TR5 may be turned-on in response to a high voltage of the clock-bar signal CKVB received through the second clock terminal CK2. In another embodiment, the fifth transistor TR5 may be turned-on in response to a low voltage of the clock-bar signal CKVB received through the second clock terminal CK2. As the fifth transistor TR5 is turned-on, the voltage level of the output node OP may be decreased to the first discharge voltage VSS1 (i.e., discharged).

As used herein, the expression "a transistor is turned-off" represents that a current does not flow between the first electrode and the second electrode of the transistor according to the control electrode. Further, the expression "a transistor is turned-on" represents that a current flows between the first electrode and the second electrode of the transistor according to the control electrode.

The second discharge part 50 includes a sixth transistor TR6 and a seventh transistor TR7. In one or more embodiments, each of the sixth and seventh transistors TR6 and TR7 may be a discharge transistor. The sixth transistor TR6 includes a control electrode connected to the second clock terminal CK2, a first electrode connected to each of the carry terminal CR and the charge node QP (e.g., via the third transistor TR3), and a second electrode connected to the second discharge terminal V2. The sixth transistor TR6 may be turned-on in response to the high voltage of the clock-bar signal CKVB received through the second clock terminal CK2. As the sixth transistor TR6 is turned-on, a voltage level of the carry terminal CR is decreased to the second discharge voltage VSS2. When the clock-bar signal CKVB is shifted from the low voltage to the high voltage, the clock signal CKV is shifted from the high voltage to the low voltage.

The seventh transistor TR7 includes a control electrode connected to the second input terminal IN2, a first electrode connected to the charge node QP, and a second electrode connected to the second discharge terminal V2. The seventh transistor TR7 is turned-on in response to a carry signal $CR_{i+6}$ outputted from the i+6-th stage. As the seventh transistor TR7 is turned-on, the first node voltage level of the charge node QP is decreased to the second discharge voltage VSS2.

As described above, after the gate signal Gi is outputted, the first discharge part 40 and the second discharge part 50 may decrease the voltage level of each of the charge node QP, the output node OP, and the carry terminal CR to the first discharge voltage VSS1 or the second discharge voltage VSS2.

As described in FIGS. 3 and 4, the first gate signal G1 may be outputted through the first stage SRC1 in response to the first clock signal CKV1 having the high voltage. Data voltages may be charged to the pixels connected to the first gate line in response to the first gate signal G1.

After the data voltages are charged to the pixels connected to the first gate line in response to the first gate signal G1, the first node voltage of the charge node QP may be decreased. That is, when an i−1-th carry signal is shifted from the high voltage to the low voltage, the first transistor TR1 of the pre-charge part 10 is turned-off. As a result, as the first node voltage level of the charge node QP is gradually decreased, the second transistor TR2 of the charge part 20 and the fourth transistor TR4 of the output part 30 are turned-off.

Thereafter, the second gate signal G2 may be outputted through the second stage SRC2 in response to the second clock signal CKV2. The data voltages may be charged to the pixels connected to the second gate line in response to the second gate signal G2.

As illustrated in FIG. 4, the first section P1 of the first clock signal CKV1 and the second section P2 of the second clock signal CKV2 may overlap (e.g., overlap in time with) each other. For example, the first gate signal G1 may be outputted from the first stage SRC1 in response to the high voltage of the first clock signal CKV1, and, at the same time, the charge node QP of the second stage SRC2 may be pre-charged in response to the high voltage of the second clock signal CKV2. As the second transistor TR2 and the fourth transistor TR4 of the first stage SRC1 are turned-off, the voltage level of the gate signal G1 may be decreased. Thereafter, the second signal G2 may be outputted from the second stage SRC2.

The first clock signal CKV1 maintains the high voltage even while the second gate signal G2 is outputted from the second stage SRC2. As a result, coupling between the first electrode of the fourth transistor TR4 and the control electrode of the second transistor TR2 may be generated due to the high voltage of the first clock signal CKV1. Particularly, when the display device DD is exposed to a high temperature, an intensity of the coupling may be increased, and, due to this, the first node voltage of the charge node QP may be increased. As a result, the second transistor TR2 and the fourth transistor TR4 may be turned-on to re-output the first gate signal from the first stage SRC1 while the second gate signal G2 is outputted from the second stage SRC2.

According to an embodiment of the present disclosure, as the voltage level of the second charge voltage VSS2 is controlled, an operation of the sixth transistor TR6 contained in the second discharge part 50 may be controlled.

For example, when the display device is in a high temperature mode, the first node voltage of the charge node QP may be discharged through the sixth transistor TR6 that is connected (e.g., electrically connected) to the charge node QP (e.g., via the third transistor TR3). When it is detected that the display device DD is in the high temperature state, the voltage level of the second discharge voltage VSS2 may be controlled to the first voltage level that is lower than the low voltage of the first clock-bar signal CKVB1. The first voltage level of the second discharge voltage VSS2 may be set in a range from about −20V to about −30V.

In this case, the second voltage level of the low voltage of the first clock-bar signal CKVB1 received from the control electrode of the sixth transistor TR6 may be lower than the first voltage level of the second discharge voltage VSS2 received from the second electrode of the sixth transistor TR6. Thus, the sixth transistor TR6 may be turned-on, and the first node voltage of the charge node QP, which is connected (e.g., electrically connected) to the first electrode of the sixth transistor TR6 (e.g., via the third transistor TR3), may be discharged to the second discharge voltage VSS2.

For example, when the display device DD is in a low temperature mode, the sixth transistor TR6 may maintain the turned-off state. An operation method of the display device DD in the low temperature mode or the high temperature mode will be described in more detail below.

Figure 6:
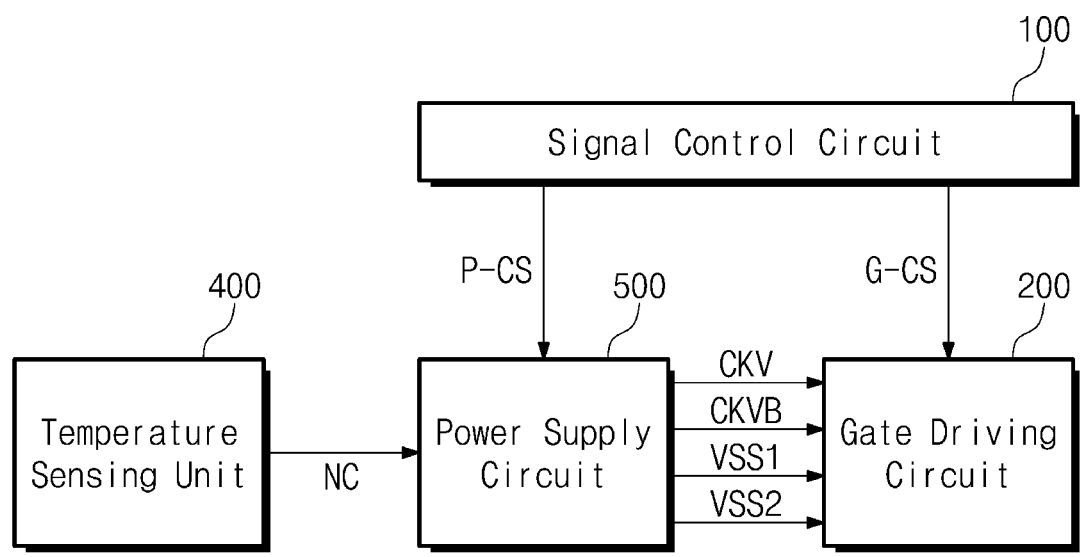
FIG. 6 is a block diagram showing the display device according to an embodiment of the present disclosure.
Figure 7A:
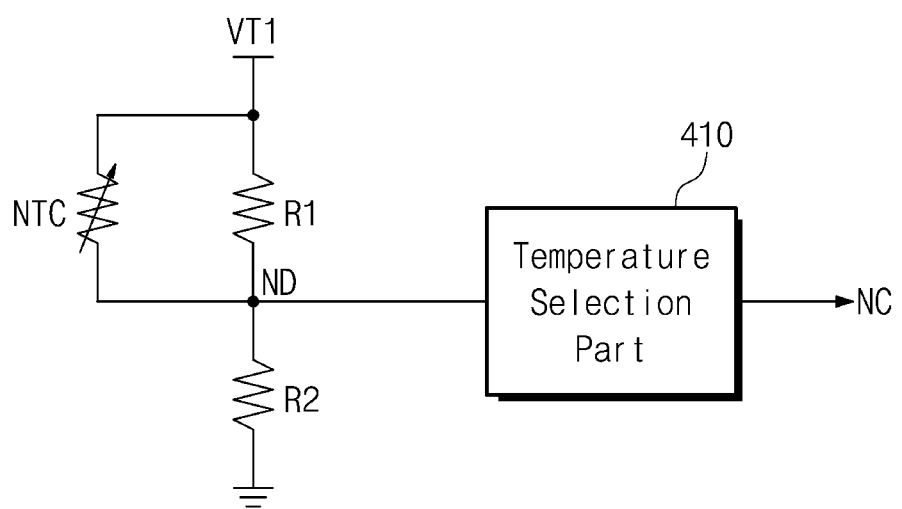
FIG. 7A is a circuit diagram showing a temperature sensing unit according to an embodiment of the present disclosure.
Figure 7B:
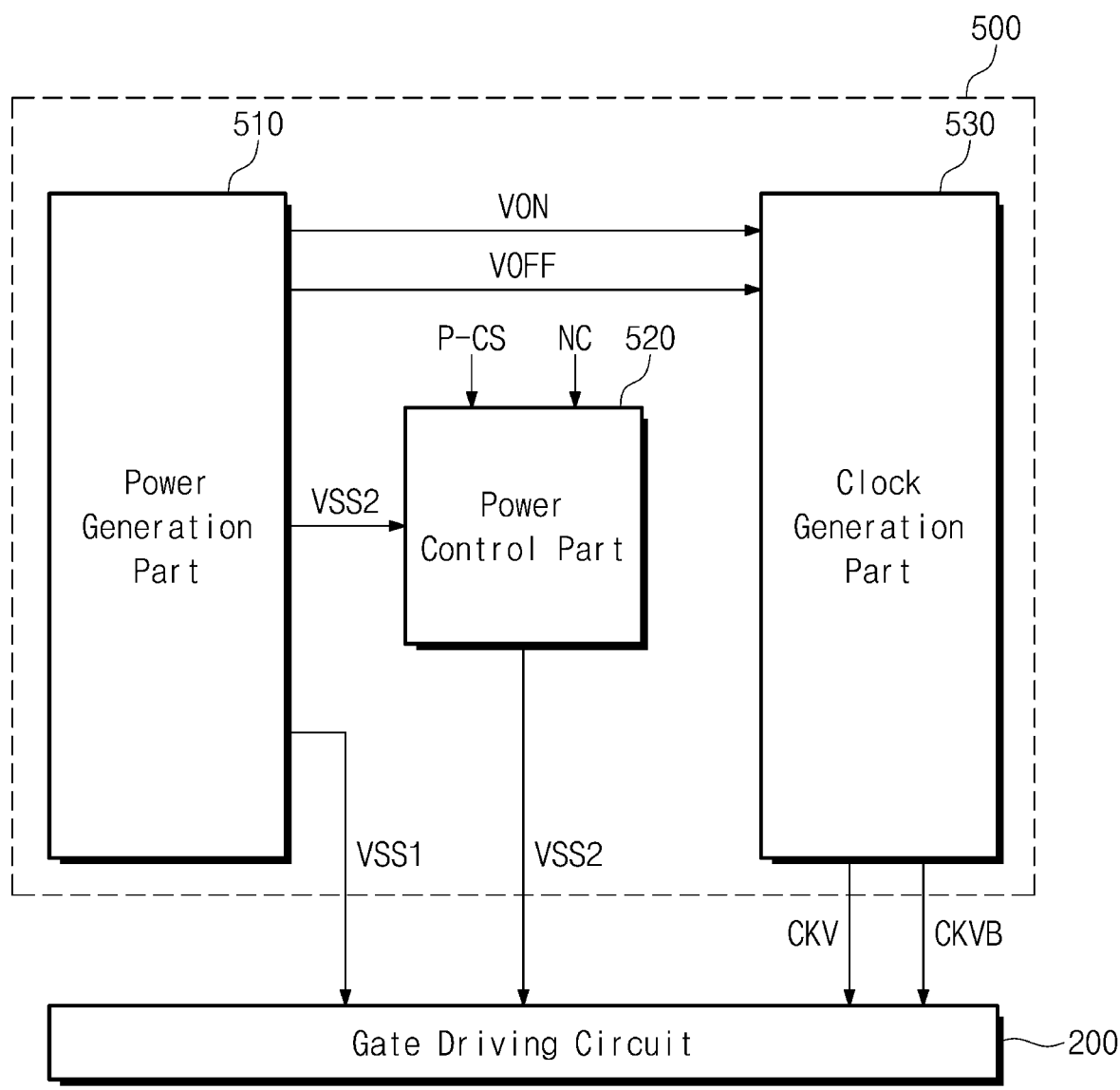
FIG. 7B is a block diagram showing a power supply circuit according to an embodiment of the present disclosure.
Figure 7C:
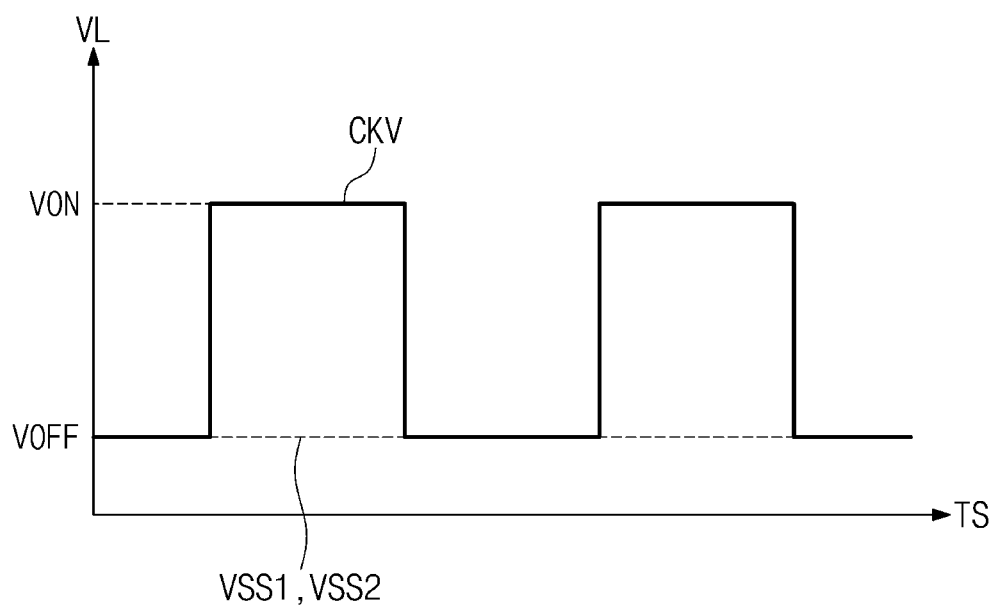
FIG. 7C is a timing diagram showing a clock signal according to an embodiment of the present disclosure.

FIG. 6 is a block diagram showing the display device according to an embodiment of the present disclosure. FIG. 7A is a circuit diagram showing a temperature sensing unit according to an embodiment of the present disclosure. FIG. 7B is a block diagram showing a power supply circuit according to an embodiment of the present disclosure. FIG. 7C is a timing diagram illustrating a clock signal according to an embodiment of the present disclosure.

Referring to FIG. 6, the display device DD may further include a temperature sensing unit (e.g., a temperature sensor or temperature sensing circuit) 400 and a power supply circuit 500 in addition to the signal control circuit 100 and the gate driving circuit 200 illustrated in FIG. 2.

The temperature sensing unit 400 may detect an external temperature and output a temperature control signal NC based on the detected temperature. In more detail, referring to FIG. 7A, the temperature sensing unit 400 includes a temperature sensor NTC, a first resistor R1, a second resistor R2, and a temperature selection part 410.

The first resistor R1 and the second resistor R2 are series-connected (connected in series) with a node ND therebetween. Each of the first resistor R1 and the second resistor R2 may have a fixed value. The temperature sensor NTC may be a resistor and parallel-connected (connected in parallel) to the first resistor R1 and series-connected (connected in series) to the second resistor R2. The temperature sensor NTC may be a variable resistor. The temperature sensor NTC may have a resistance value that is varied according to an external temperature.

The temperature selection part 410 may output the temperature control signal NC, which distinguishes whether the external temperature is a high temperature mode or a low temperature mode, by detecting a voltage level of the node ND, which is varied based on a reference voltage VT1. For example, when the voltage level of the node ND is equal to or greater than a reference level, the temperature selection part 410 outputs the temperature control signal NC according to the high temperature mode. When the voltage level of the node ND is less than the reference level, the temperature selection part 410 outputs the temperature control signal NC representing the low temperature mode. In one or more embodiments, the reference level may be a room temperature.

Referring to FIG. 6, the temperature sensing unit 400 may output the temperature control signal NC to each of the signal control circuit 100 and the power supply circuit 500.

The signal control circuit 100 may output a power control signal P-CS to the power supply circuit 500. The signal control circuit 100 may output the power control signal P-CS, which alternately repeats the first signal and the second signal, to the power supply circuit 500. This will be described in more detail below in FIG. 9A.

The power supply circuit 500 may generate the clock signal CKV, the clock-bar signal CKVB, the first discharge voltage VSS1, and the second discharge voltage VSS2. The power supply circuit 500 may output the clock signal CKV, the clock-bar signal CKVB, the first discharge voltage VSS1, and the second discharge voltage VSS2 to the gate driving circuit 200.

According to an embodiment of the present disclosure, the power supply circuit 500 receives the power control signal P-CS from the signal control circuit 100 and receives the temperature control signal NC from the temperature sensing unit 400. The power supply circuit 500 may adjust a voltage level of the second discharge voltage VSS2 based on the power control signal P-CS and the temperature control signal NC.

In more detail, referring to FIG. 7B, the power supply circuit 500 includes a power generation part 510, a power control part 520, and a clock generation part 530.

The power generation part 510 may generate the first discharge voltage VSS1 and the second discharge voltage VSS2. The power generation part 510 outputs the first discharge voltage VSS1 to the gate driving circuit 200 and the second discharge voltage VSS2 to the power control part 520. Also, the power generation part 510 outputs a gate-on voltage VON to a clock generation part 530. In one or more embodiments, the power generation part 510 outputs a gate-off voltage VOFF to a clock generation part 530.

The power control part 520 receives the temperature control signal NC, the power control signal P-CS, and the second discharge voltage VSS2. According to an embodiment of the present disclosure, the power control part 520 may adjust the voltage level of the second discharge voltage VSS2 in response to the temperature control signal NC and the power control signal P-CS.

In one or more embodiments, the power control part 520 may output the second discharge voltage VSS2 having a first voltage level according to the temperature control signal NC in the high temperature mode. The first voltage level of the second discharge voltage VSS2 may be lower than the first discharge voltage VSS1 and the low voltage of the clock-bar signal CKVB.

In one or more embodiments, the power control part 520 may output the second discharge voltage VSS2 having a second voltage level according to the temperature control signal NC in the low temperature mode. The second voltage level of the second discharge voltage VSS2 may be equal to or substantially equal to the first discharge voltage VSS1 and the low voltage of the clock-bar signal CKVB.

According to an embodiment of the present disclosure, in the high temperature mode, the power control part 520 may output the second discharge voltage VSS2 in response to the power control signal P-CS. The power control signal P-CS may include a first pulse signal corresponding to the first mode and a second pulse signal corresponding to the second mode, which are alternately repeated.

For example, the power control part 520 outputs the second discharge voltage VSS2 having the first voltage level in the first mode and the second discharge voltage VSS2 having the second voltage level in the second mode.

In more detail, the sixth transistor TR6 of the second discharge part 50 in FIG. 5 may be turned-on in response to the second discharge voltage VSS2 having the first voltage level. Thus, the sixth transistor TR6 may be turned-on, and the first node voltage of the charge node QP, which is connected (e.g., electrically connected) to the first electrode, may be discharged to the second discharge voltage VSS2.

When the sixth transistor TR6 is continuously turned-on, deterioration of the sixth transistor TR6 may occur.

According to an embodiment of the present disclosure, the power control part 520 is turned-off in response to the second discharge voltage VSS2 having the second voltage level in the second mode. That is, in the high temperature mode, the power control part 520 may alternately and repeatedly output the second discharge voltage VSS2 having the first voltage level and the second discharge voltage VSS2 having the second voltage level. In other words, in the high temperature mode, the power control part 520 may output the second discharge voltage VSS2 such that the second discharge voltage VSS2 alternates between a first voltage level and a second voltage level. Thus, in the high temperature mode, the sixth transistor TR6 may repeat a turn-on operation and a turn-off operation.

Also, in the low temperature mode, the power control part 520 may continuously output the second discharge voltage VSS2 having the second voltage level according to the temperature control signal NC and the power control signal P-CS. As a result, the sixth transistor TR6 of the second discharge part 50 in FIG. 5 may be turned-off.

The clock generation part 530 receives a gate-on voltage VON and a gate-off voltage VOFF and, in response to this, generates the clock signal CKV and the clock-bar signal CKVB. In FIG. 7C, a horizontal axis represents a time TS, and a vertical axis represents a voltage level VL. The clock signal CKV includes a high voltage corresponding to the gate-on voltage VON and a low voltage corresponding to the gate-off voltage VOFF. In one or more embodiments, the clock-bar signal CKVB includes a high voltage corresponding to the gate-on voltage VON and a low voltage corresponding to the gate-off voltage VOFF. The clock generation part 530 outputs the clock signal CKV and the clock-bar signal CKVB to the gate driving circuit 200.

Figure 10:
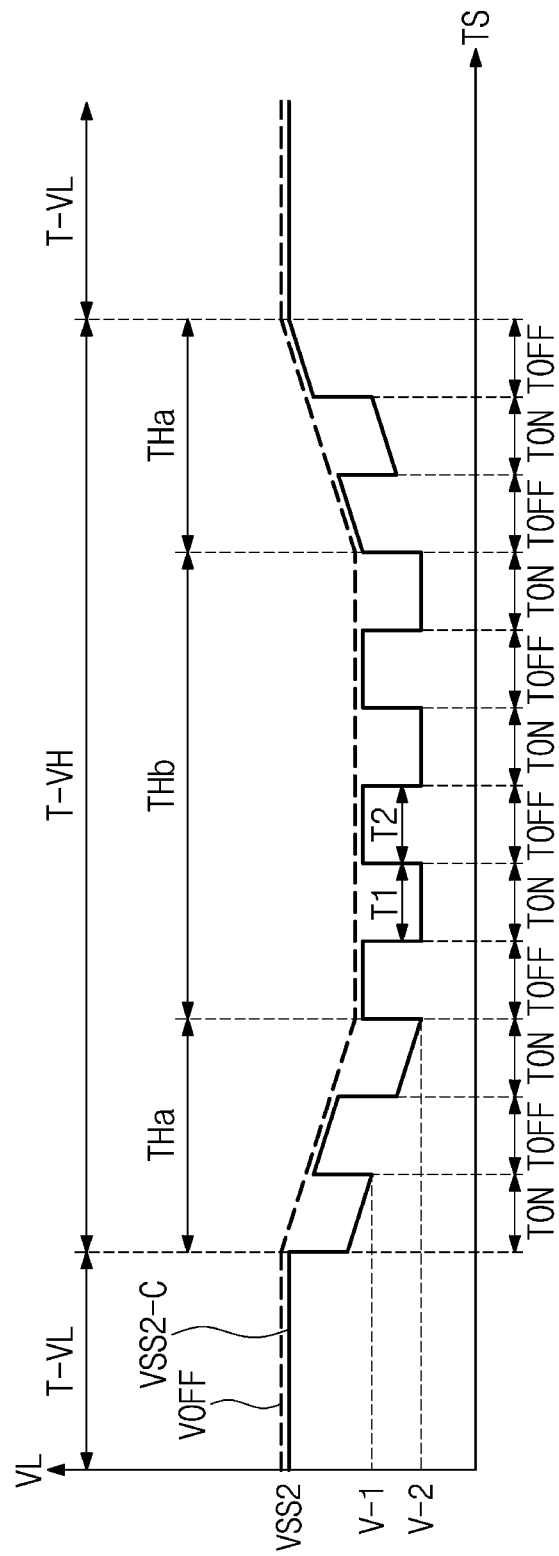
FIG. 10 is a timing diagram showing an operation of the display device in a high temperature state according to an embodiment of the present disclosure.

According to an embodiment of the present disclosure, the first section P1 of each of the clock signals CKV may correspond to one of a first sub-section T-VL (e.g., as shown in FIG. 10) and a second sub-section T-VH (e.g., as shown in FIG. 10). In more detail, the first sub-section represents a section in which the sixth transistor TR6 is turned-off. In the low temperature mode, the first section P1 of each of the clock signals CKV may maintain the first sub-section.

The second sub-section represents a section in which the first mode in which the sixth transistor TR6 is turned-on and the second mode in which the sixth transistor TR6 is turned-off are alternately repeated. In the high temperature mode, the first section P1 of each of the clock signals CKV may maintain the second sub-section.

Figure 8:
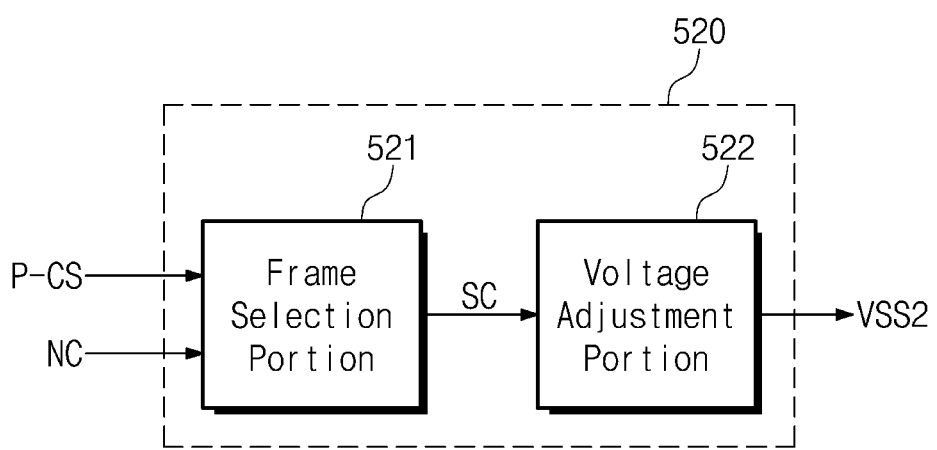
FIG. 8 is a block diagram showing a power control part according to an embodiment of the present disclosure.
Figure 9A:
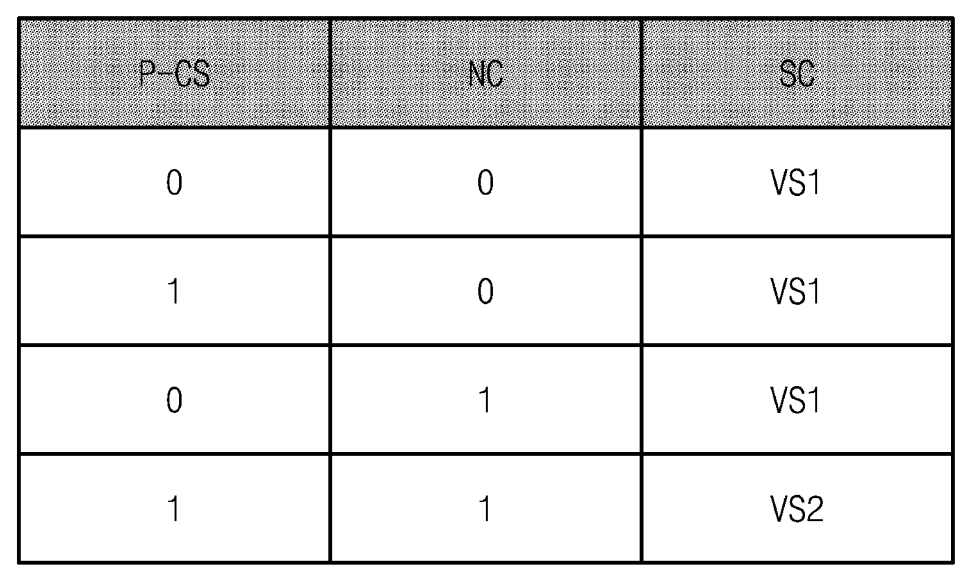
Figure 9B:
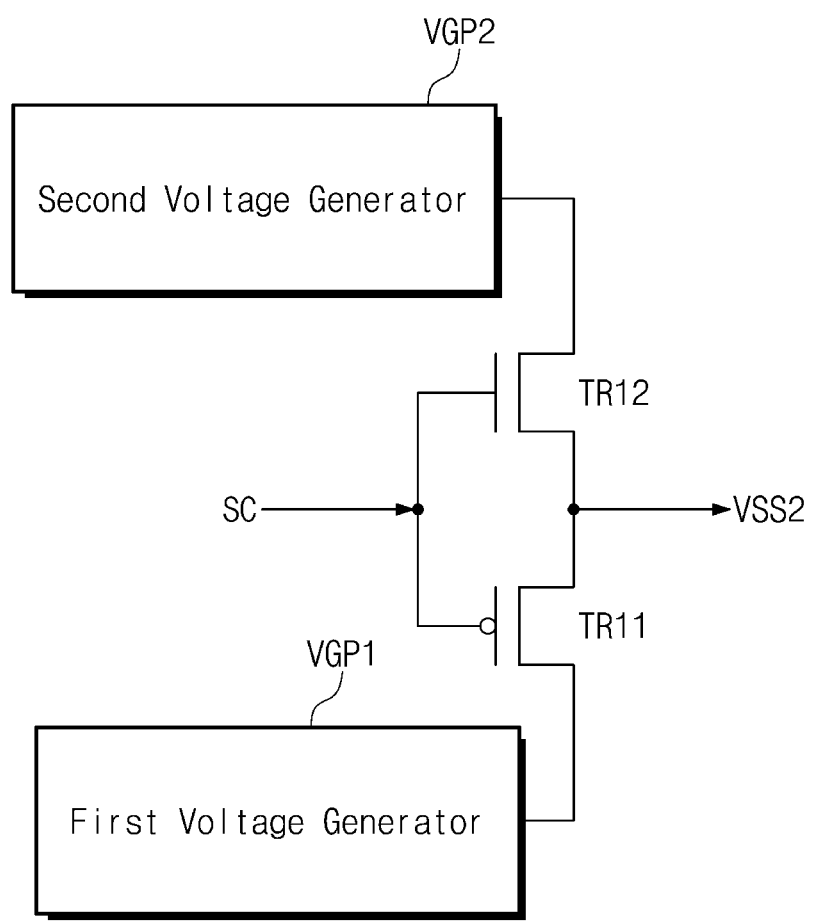
FIG. 9B is a circuit diagram showing a voltage control part in FIG. 8 according to an embodiment of the present disclosure.

FIG. 8 is a block diagram showing the power control part according to an embodiment of the present disclosure. FIG. 9A is a table showing an operation of a frame selection part in FIG. 8 according to an embodiment of the present disclosure. FIG. 9B is a circuit diagram showing the voltage control part in FIG. 8 according to an embodiment of the present disclosure.

Referring to FIGS. 7B and 8, the power control part 520 includes a frame selection portion 521 and a voltage adjustment portion 522.

The frame selection part 521 receives the temperature control signal NC and the power control signal P-CS. The frame selection part 521 may output a selection signal SC, which selects the voltage level of the second discharge voltage VSS2, in response to the temperature control signal NC and the power control signal P-CS.

In more detail, referring to FIG. 9A, the power control signal P-CS may include a first signal having 0 bit and a second signal having 1 bit. The signal control circuit 100 may output the power control signal P-CS, which alternately repeats the first signal and the second signal, to the power supply circuit 500.

The temperature control signal NC may include a first temperature signal having 0 bit and a second temperature signal having 1 bit. The first temperature signal may correspond to the low temperature mode, and the second temperature signal may correspond to the high temperature mode.

The frame selection portion 521 may output the selection signal SC having a first level VS1 according to the power control signal P-CS corresponding to the first signal and the temperature control signal NC corresponding to the first temperature signal.

The frame selection portion 521 may output the selection signal SC having a first level VS1 according to the power control signal P-CS corresponding to the second signal and the temperature control signal NC corresponding to the first temperature signal. In one or more embodiments, frame selection portion 521 may output the selection signal SC having a first level VS1 in response to the temperature control signal NC corresponding to the first temperature signal regardless of the power control signal P-CS.

The frame selection portion 521 may output the selection signal SC having the first level VS1 according to the power control signal P-CS corresponding to the first signal and the temperature control signal NC corresponding to the second temperature signal.

The frame selection portion 521 may output the selection signal SC having a second level VS2 according to the power control signal P-CS corresponding to the second signal and the temperature control signal NC corresponding to the second temperature signal.

Referring to FIG. 8, the voltage adjustment portion 522 may adjust the voltage level of the second discharge voltage VSS2 in response to the selection signal SC.

In more detail, referring to FIG. 9B, the voltage adjustment portion 522 includes a first voltage generator VGP1, a second voltage generator VGP2, a first selection transistor TR11, and a second selection transistor TR12. The selection signal SC is outputted to each of a control electrode of the first selection transistor TR11 and a control electrode of the second selection transistor TR12.

According to an embodiment of the present disclosure, one of the first selection transistor TR11 and the second selection transistor TR12 may be turned-on, and the other may be turned-off according to the selection signal SC. That is, the first selection transistor TR11 and the second selection transistor TR12 may be inversely switched according to the selection signal SC. For example, the first selection transistor TR11 may be a P-MOS transistor, and the second selection transistor TR12 may be an N-MOS transistor. In one or more embodiments, the first selection transistor TR11 may be an N-MOS transistor and the second selection transistor TR12 may be a P-MOS transistor with suitable changes to selection signal SC, first voltage generator VGP1, and/or second voltage generator VGP2.

The frame selection portion 521 outputs the selection signal SC having the first level VS1 according to the first signal of the power control signal P-CS and the first temperature signal of the temperature control signal NC. A feature in which the selection signal SC has the first level VS1 represents that the sixth transistor TR6 is turned-off. That is, when the selection signal SC having the first level VS1 is outputted, the voltage level of the second discharge voltage VSS2 corresponds to the low voltage VOFF (e.g., as shown in FIG. 7C) of the clock signal CKV or the clock-bar signal CKVB.

The first selection transistor TR11 may be turned-on, and the second selection transistor TR12 may be turned-off according to the selection signal SC having the first level VS1. As a result, the second discharge voltage VSS2 having the second voltage level may be outputted from the first voltage generator VGP1.

The frame selection portion 521 outputs the selection signal SC having the second level VS2 according to the second signal of the power control signal P-CS and the second temperature signal of the temperature control signal NC. A feature in which the selection signal SC has the second level VS2 represents that the sixth transistor TR6 is turned-on. That is, when the selection signal SC having the second level VS2 is outputted, the voltage level of the second discharge voltage VSS2 corresponds to the first voltage level that is lower than the low voltage VOFF (e.g., as shown in FIG. 7C) of the clock signal CKV or the clock-bar signal CKVB.

The first selection transistor TR11 may be turned-off, and the second selection transistor TR12 may be turned-on according to the selection signal SC having the second level VS2. As a result, the second discharge voltage VSS2 having the first voltage level may be outputted from the second voltage generator VGP2.

As the first signal and the second signal are alternately repeated, in the high temperature mode, the power control signal P-CS may be outputted such that the second discharge voltage VSS2 having the first voltage level and the second discharge voltage VSS2 having the second voltage level are alternately repeated.

Figure 11:
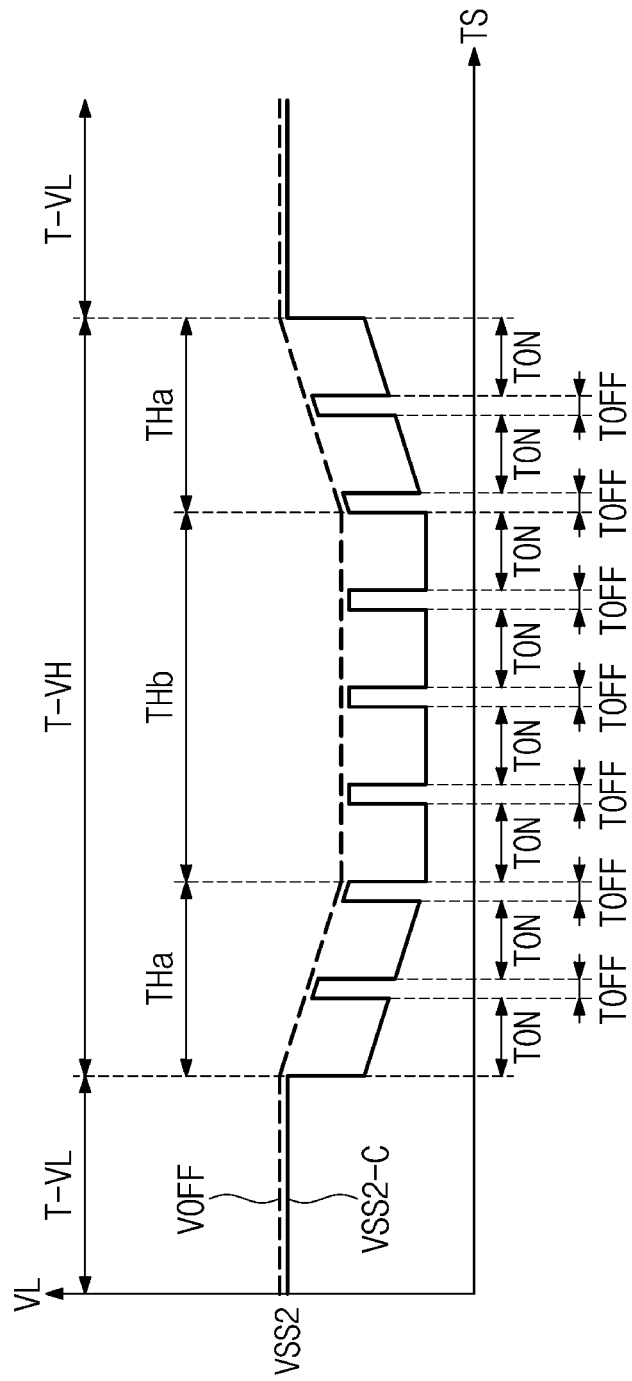
FIG. 11 is a timing diagram showing an operation of the display device in a high temperature state according to another embodiment of the present disclosure.
Figure 12A:
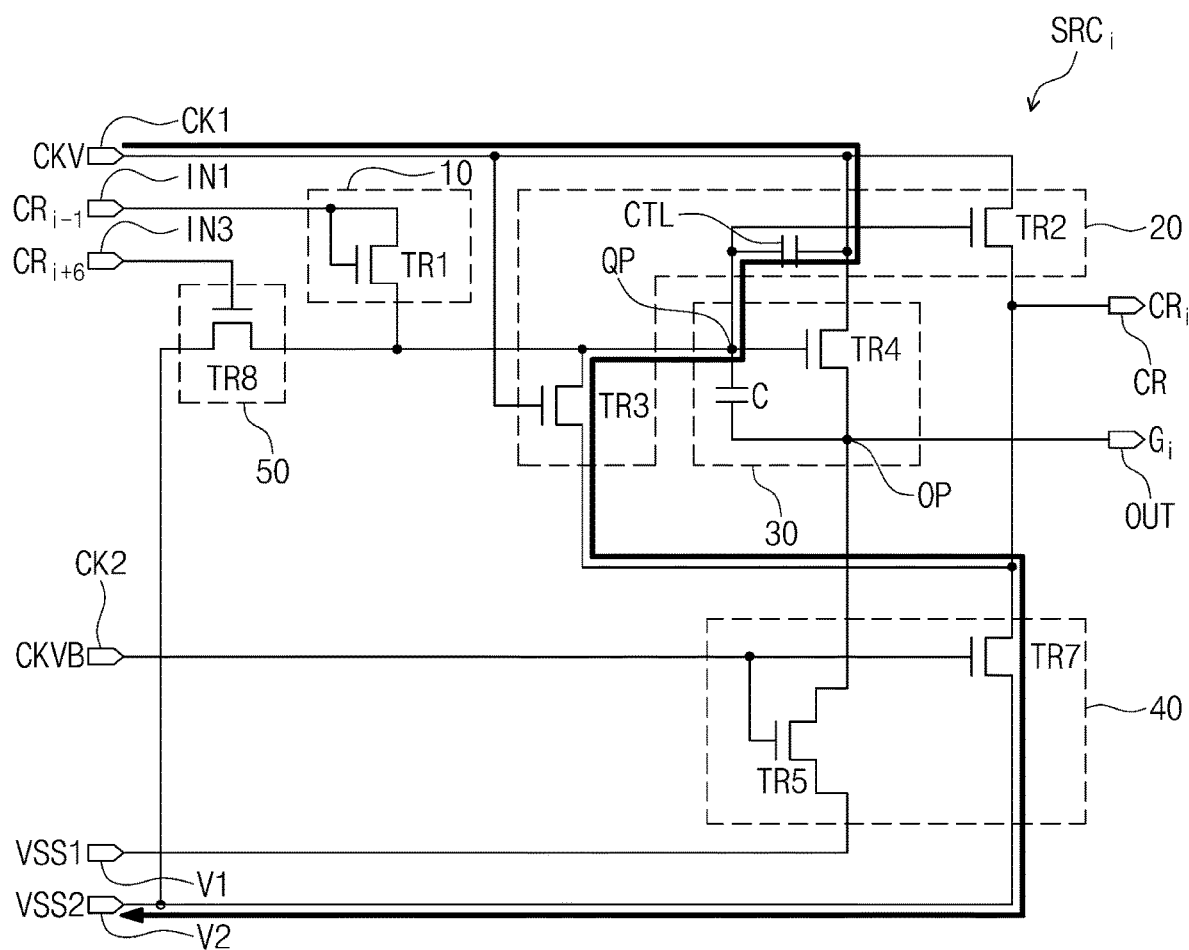
FIG. 12A is a circuit diagram showing a stage according to an embodiment of the present disclosure.
Figure 12B:
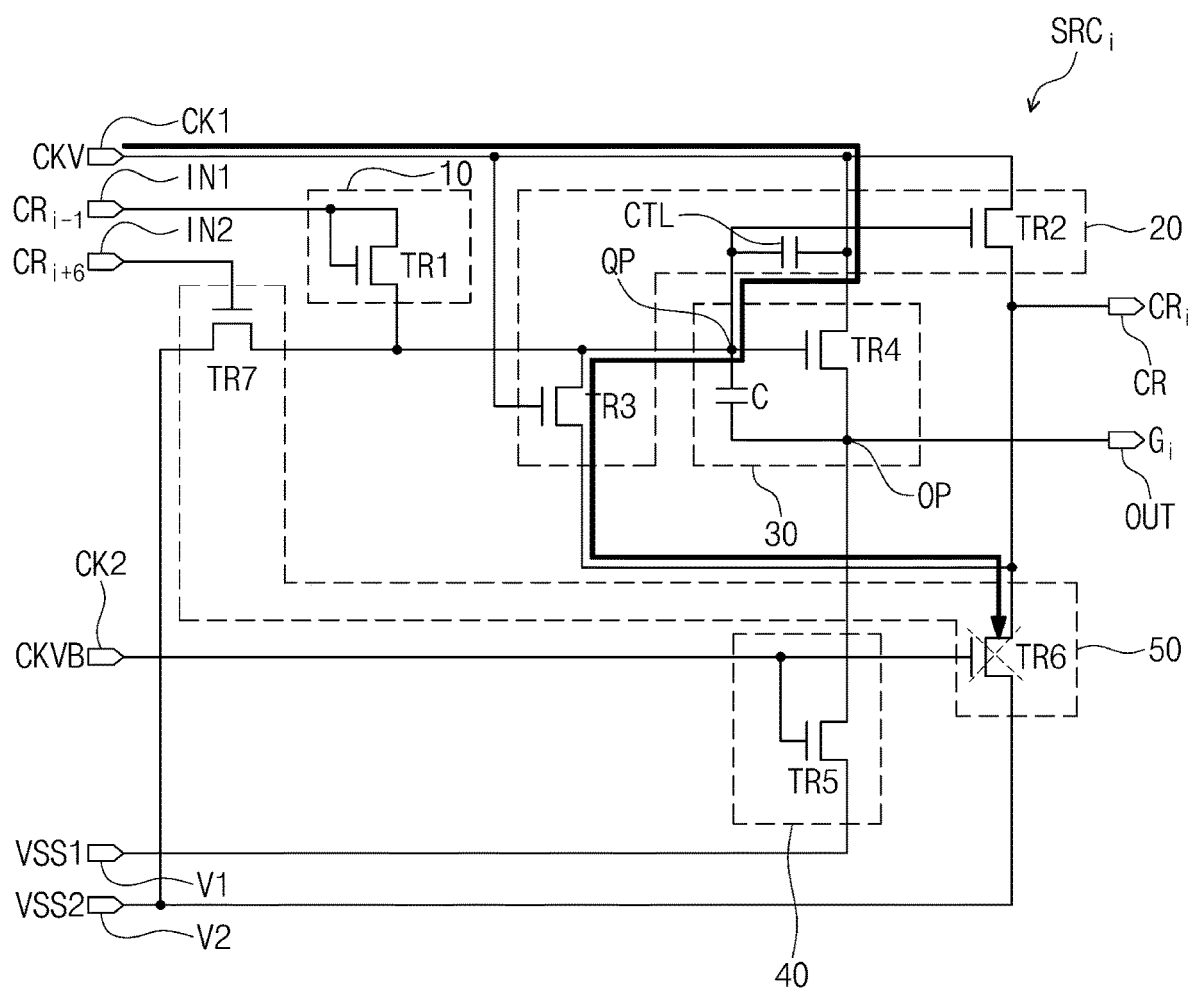
FIG. 12B is a circuit diagram showing a stage according to an embodiment of the present disclosure.

FIG. 10 is a timing diagram showing an operation of the display device in the high temperature state according to an embodiment of the present disclosure. FIG. 11 is a timing diagram showing an operation of the display device in the high temperature state according to another embodiment of the present disclosure. FIG. 12A is a circuit diagram of a stage device according to an embodiment of the present disclosure. FIG. 12B is a circuit diagram of a stage device according to an embodiment of the present disclosure.

Referring to FIGS. 6, 9B, and 10, a horizontal axis represents a time TS, and a vertical axis represents a voltage level VL. As described above, when the temperature control signal NC is the first temperature signal corresponding to the low temperature mode, the first section P1 (e.g., as shown in FIG. 4) of each of the clock signals CKV having a high voltage may correspond to the first sub-section T-VL. The power supply circuit 500 may output the second discharge voltage VSS2 in correspondence to a voltage level of the clock-bar signal CKVB having a low voltage. As a result, the sixth transistor TR6 in FIG. 5 maintains a turned-off state.

When the temperature control signal NC is the second temperature signal corresponding to the high temperature mode, the first section P1 of each of the clock signals CKV having a high voltage may correspond to the second sub-section T-VH. The second sub-section T-VH includes a variable section THa and a fixed section THb.

Also, each of the variable section THa and the fixed section THb includes an on-section TON and an off-section TOFF, which are alternately repeated. The alternately repeated on-section TON and off-section TOFF may be controlled in correspondence to the first signal and the second signal of the power control signal P-CS.

The on-section TON represents a section in which the second discharge voltage VSS2 having the first voltage level, which is less than the low voltage of the clock signal CKV, is outputted from the second voltage generator VGP2. The off-section TOFF represents a section in which the second discharge voltage VSS2 having the second voltage level, which corresponds to the low voltage of the clock-bar signal CKVB, is outputted from the second voltage generator VGP2.

For example, in the variable section THa, the second voltage generator VGP2 may output the second discharge voltages VSS2 having different first voltage levels compared to a plurality of on-sections TON as shown in FIG. 10. For example, a first voltage level V−1 of the second discharge voltage according to a first on-section TON may be greater than a first voltage level V−2 of the second discharge voltage according to a second on-section TON.

For example, in the fixed section THa, the second voltage generator VGP2 may output the second discharge voltages VSS2 having the same first voltage level to the plurality of on-sections TON.

According to an embodiment of the present disclosure, the on-section TON and off-section TOFF (e.g., two neighboring sections such as the on-section TON and the off-section TOFF shown in FIG. 10) may have the same or substantially the same in duration. For example, the on-section TON has a first time T1, and the off-section has a second time T2. As illustrated in FIG. 10, the first time T1 and the second time T2 may be the same in duration as each other.

According to another embodiment of the present disclosure, the on-section TON and the off-section TOFF (e.g., two neighboring sections such as the on-section TON and the off-section TOFF shown in FIG. 11) may have time sections that are different in duration from each other. For example, the on-section TON may be maintained for a time greater than the off-section TOFF.

Referring to FIG. 12A, the clock signal CKV may correspond to the first section P1 (e.g., as shown in FIG. 4) having a high voltage. In the high temperature mode, coupling CTL between the first electrode of the fourth transistor TR4 and the control electrode of the second transistor TR2 may occur. In this case, the first node voltage level of the charge node QP may be increased.

According to an embodiment of the present disclosure, in the on-section TON of FIG. 10, the power supply circuit 500 may output the second discharge voltage VSS2 having the first voltage level to the second discharge terminal V2 in response to the temperature control signal NC corresponding to the second temperature signal. As the first voltage level of the second discharge voltage VSS2 is set less than the voltage level of the low voltage of the clock-bar signal CKVB received from the control electrode of the sixth transistor TR6, the sixth transistor TR6 may be turned-on. Thus, the first node voltage of the charge node QP charged by the coupling CTL may be discharged to the second discharge voltage VSS2.

Referring to FIG. 12B, in the off-section TOFF of FIG. 10, the power supply circuit 500 may output the second discharge voltage VSS2 having the second voltage level to the second discharge terminal V2. As the second voltage level of the second discharge voltage VSS2 is substantially the same as the low voltage of the clock-bar signal CKVB received from the control electrode of the sixth transistor TR6, the sixth transistor TR6 may be turned-off. Thus, deterioration of the sixth transistor TR6 may be prevented or substantially prevented.

Figure 13:
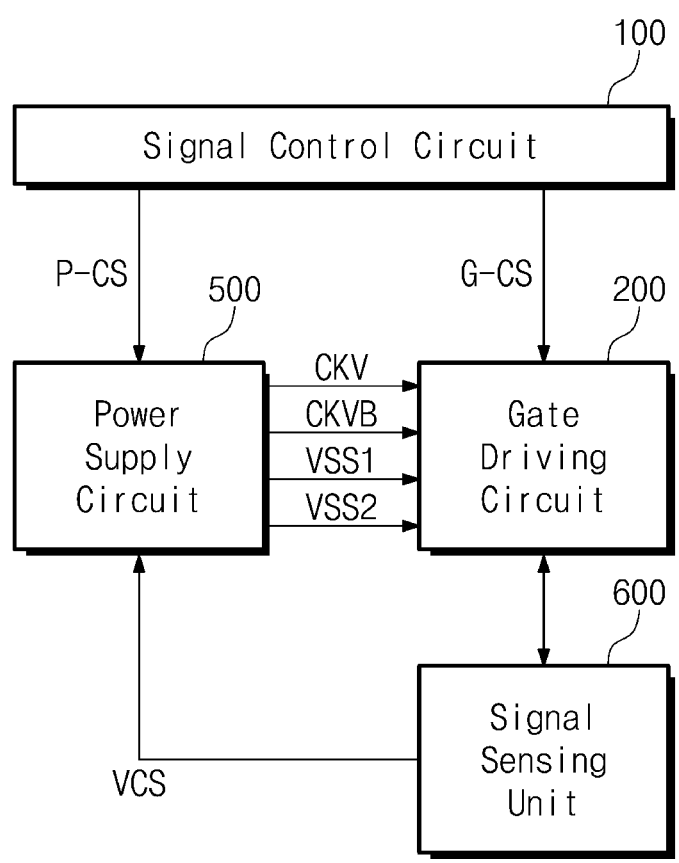
FIG. 13 is a block diagram showing a display device according to another embodiment of the present disclosure.
Figure 14:
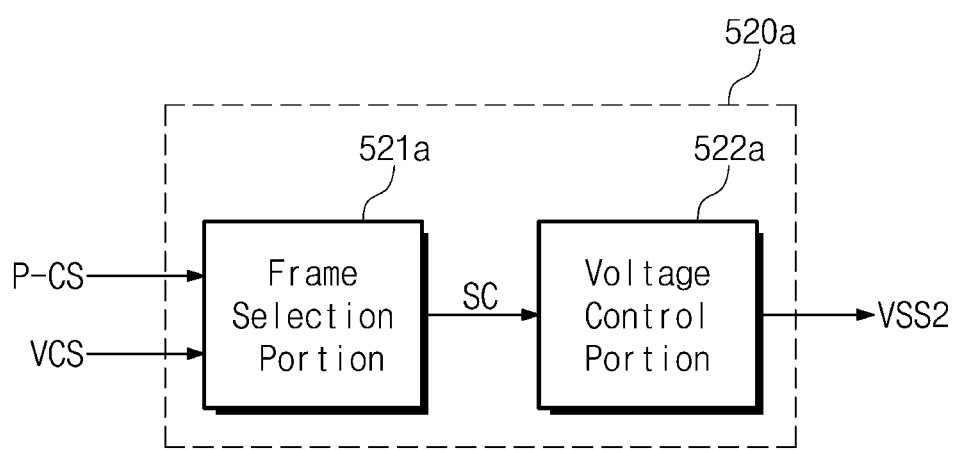
FIG. 14 is a block diagram showing a power control part according to another embodiment of the present disclosure.

FIG. 13 is a block diagram showing a display device according to another embodiment of the present disclosure. FIG. 14 is a block diagram showing a power control part according to another embodiment of the present disclosure.

When compared with the display device DD in FIG. 6, a display device DD in FIG. 13 further includes a signal sensing unit (e.g., a signal analysis unit or circuit) 600 and omits the temperature sensing unit 400. Operations of the rest components are substantially the same as each other, and description thereof will be omitted (i.e., not repeated) for convenience.

Referring to FIG. 13, the signal sensing unit 600 may be connected (e.g., electrically connected) to the plurality of gate lines GL1 to GLn in FIG. 2. The signal sensing unit 600 receives the gate signals, which are outputted from the gate lines GL1 to GLn, from the gate driving circuit 200 and analyzes whether each of the gate signals is outputted with a normal or set timing.

According to an embodiment of the present disclosure, the signal sensing unit 600 outputs an analysis control signal VCS, which analyzes whether each of the gate signals is outputted with a normal or set timing, to the power supply circuit 500.

For example, the signal sensing unit 600 outputs the analysis control signal VCS according to an error mode when a gate signal is outputted to a k−1-th gate line while a gate signal is outputted to a k-th gate line. In this case, the power supply circuit 500 outputs the second discharge voltage VSS2 having the first voltage level that is less than the low voltage of the clock-bar signal CKVB.

For example, when the gate signals are normally outputted to the gate lines, the signal sensing unit 600 outputs the analysis control signal VCS according to a normal mode. In this case, the power supply circuit 500 outputs the second discharge voltage VSS2 having the second voltage level corresponding to the low voltage of the clock-bar signal CKVB.

Referring to FIG. 14, the power control part 520a includes a frame selection portion 521a and a voltage control portion 522a. The frame selection portion 521a may output the selection signal SC in response to the analysis control signal VCS and the power control signal P-CS. The first sub-section T-VL and the second sub-section T-VH in FIG. 10 may be determined according to the normal mode and the error mode of the analysis control signal VCS. The power control signal P-CS may be substantially the same as the operation method described through FIG. 9A.

According to the embodiment of the present disclosure, the operation of the discharge transistor connected to the charge node may be controlled by controlling the voltage level of the discharge voltage. Particularly, when the display device detects the high temperature state, the voltage level of the discharge voltage may be controlled to be less than the low voltage of the clock-bar signal. As a result, the discharge transistor may be turned-on, and the node voltage of the charge node may be discharged to the discharge voltage.

As a result, the overall driving reliability of the display device may be enhanced.

Although the exemplary embodiments of the present disclosure have been described, it is understood that the present disclosure should not be limited to these exemplary embodiments but various changes and modifications can be made by one ordinary skilled in the art within the spirit and scope of the present disclosure as hereinafter claimed. Hence, the real protective scope of the present disclosure shall be determined by the technical scope of the accompanying claims, and equivalents thereof.

What is claimed is:
1. A gate driving circuit comprising:
a charge part connected to a charge node and configured to charge a clock signal having a first high voltage to the charge node during a first section;

an output part connected to each of the charge node and an output node and configured to charge the first high voltage to the output node in response to a first node voltage of the charge node during the first section and output a second node voltage of the output node to a gate signal;

a first discharge part configured to discharge the second node voltage to a first discharge voltage in response to a clock-bar signal having a second high voltage during a second section that is consecutive to the first section; and a second discharge part configured to discharge the first node voltage to a second discharge voltage in response to the clock-bar signal during the second section, wherein the first section has one of a first sub-section, during which the second discharge part is turned-off, or a second sub-section, during which the second discharge part alternates between a first mode in which the second discharge part is turned-on and a second mode in which the second discharge part is turned-off, wherein the clock-bar signal has a first low voltage during the first section, and wherein a first voltage level of the second discharge voltage is lower than a second voltage level of the first low voltage in the first mode.

2. The gate driving circuit of claim 1, wherein the first voltage level of the second discharge voltage is substantially the same as the second voltage level of the first low voltage during the first sub-section and in the second mode.

3. The gate driving circuit of claim 1, wherein the second discharge part is configured to discharge the first node voltage to the second discharge voltage having the first voltage level in the first mode.

4. The gate driving circuit of claim 1, wherein the second discharge part comprises a first discharge transistor configured to discharge the first node voltage to the second discharge voltage having the first voltage level in response to the first low voltage of the clock-bar signal during the second section.

5. The gate driving circuit of claim 4, wherein the first discharge part comprises a second discharge transistor configured to discharge the second node voltage to the first discharge voltage in response to the first low voltage of the clock-bar signal during the second section.

6. The gate driving circuit of claim 1, wherein during the second sub-section, a voltage level of the second discharge voltage according to the first mode at a first time and a voltage level of the second discharge voltage according to the first mode at a second time are different from each other.

7. The gate driving circuit of claim 1, wherein during the second sub-section, a voltage level of the second discharge voltage according to the first mode at a first time and a voltage level of the second discharge voltage according to the first mode at a second time are substantially the same as each other.

8. The gate driving circuit of claim 1, wherein the first mode and the second mode have time sections that are substantially the same in duration as each other.

9. The gate driving circuit of claim 1, wherein the first mode and the second mode have time sections that are different in duration from each other, and a section according to the first mode is longer than a section according to the second mode.

10. A display device comprising:
a display panel;
a gate driving circuit comprising a plurality of stages configured to output a plurality of gate signals to the display panel, the plurality of stages comprising an i-stage where i is a natural number;
a temperature sensor configured to output a temperature control signal based on an external temperature;
a signal control circuit configured to output a power control signal; and
a power supply circuit configured to output a clock signal, a clock-bar signal, a first discharge voltage, and a second discharge voltage to the gate driving circuit in response to the power control signal, wherein the i-stage of the stages comprises:
a charge part configured to charge the clock signal having a first high voltage to a charge node during a first section;

an output part connected to the charge part through the charge node and configured to charge the first high voltage to an output node in response to a first node voltage of the charge node and output a second node voltage of the output node to an i-th gate signal of the gate signals;

a first discharge part connected to the output part through the output node and configured to discharge the second node voltage to a first discharge voltage in response to the clock-bar signal having a second high voltage during a second section that is consecutive to the first section; and a second discharge part electrically connected to the charge node and configured to discharge the first node voltage to a second discharge voltage in response to the clock-bar signal during the second section, wherein the first section has one of a first sub-section, during which the second discharge part is turned-off, or a second sub-section, during which the second discharge part alternates between a first mode in which the second discharge part is turned-on and a second mode in which the second discharge part is turned-off, and wherein the first section has one of the first sub-section or the second sub-section in response to the temperature control signal.

11. The display device of claim 10, wherein the power supply circuit comprises:
a power generation part configured to output the first discharge voltage and the second discharge voltage;
a clock generation part configured to output the clock signal and the clock-bar signal; and
a power control part configured to receive the second discharge voltage and control a voltage level of the second discharge voltage based on the external temperature.

12. The display device of claim 11, wherein the power control part comprises:
a frame selection portion configured to output a selection signal in response to the temperature control signal and the power control signal; and
a voltage adjustment portion configured to adjust the voltage level of the second discharge voltage in response to the selection signal.

13. The display device of claim 12, wherein the second discharge part is configured to receive a first low voltage of the clock-bar signal during the first section, and wherein a first voltage level of the second discharge voltage is lower than a second voltage level of the first low voltage in the first mode.

14. The display device of claim 12, wherein the power control signal comprises a first pulse signal corresponding to the first mode and a second pulse signal corresponding to the second mode, the first pulse signal and the second pulse signal being alternately repeated.

15. The display device of claim 10, wherein the temperature control signal comprises a first temperature signal, in which the external temperature is less than a reference temperature, and a second temperature signal, in which the external temperature is equal to or greater than the reference temperature, and wherein the first section corresponds to the first sub-section according to the first temperature signal and corresponds to the second sub-section according to the second temperature signal.

16. A display device comprising:

a display panel;

a gate driving circuit comprising a plurality of stages configured to output a plurality of gate signals to the display panel, the plurality of stages comprising an i-stage where i is a natural number;

a signal analysis circuit configured to receive the gate signals outputted from the gate driving circuit and analyze the gate signals, a signal control circuit configured to output a power control signal; and a power supply circuit configured to output a clock signal, a clock-bar signal, a first discharge voltage, and a second discharge voltage to the gate driving circuit in response to the power control signal, wherein the i-stage of the stages comprises:

a charge part configured to charge the clock signal having a first high voltage to a charge node during a first section;

an output part connected to the charge part through the charge node and configured to charge the first high voltage to an output node in response to a first node voltage of the charge node and output a second node voltage of the output node to an i-th gate signal of the gate signals;

a first discharge part connected to the output part through the output node and configured to discharge the second node voltage to a first discharge voltage in response to the clock-bar signal having a second high voltage during a second section that is consecutive to the first section; and a second discharge part connected to the charge node and configured to discharge the first node voltage to a second discharge voltage during the second section, wherein the first section has one of a first sub-section, during which the second discharge part is turned-off, or a second sub-section, during which the second discharge part alternates between a first mode in which the second discharge part is turned-on and a second mode in which the second discharge part is turned-off, and wherein the signal analysis circuit is configured to transmit an analysis control signal, which is based on an analysis result of each of the gate signals, to the power supply circuit.

17. The display device of claim 16, wherein the power supply circuit is configured to control an operation of the second discharge part in response to the analysis control signal.

18. A display device comprising:

a display panel;

a gate driving circuit comprising a plurality of stages configured to output a plurality of gate signals to the display panel, the plurality of stages comprising an i-stage where i is a natural number; and a power supply circuit configured to output a clock signal, a clock-bar signal, a first discharge voltage, and a second discharge voltage to the gate driving circuit, wherein the i-stage of the stages comprises:

a charge part configured to charge the clock signal having a first high voltage to a charge node;

an output part connected to the charge part through the charge node and configured to charge the first high voltage to an output node in response to a first node voltage of the charge node and output a second node voltage of the output node to an i-th gate signal of the gate signals;

a first discharge part connected to the output part through the output node and configured to discharge the second node voltage to a first discharge voltage in response to the clock-bar signal having a second high voltage; and a second discharge part electrically connected to the charge node and configured to discharge the first node voltage to the second discharge voltage in response to the clock-bar signal having the second high voltage, wherein the second discharge part is configured to alternate between a first mode, which discharges the first node voltage to the second discharge voltage in response to the clock-bar signal, and a second mode, which maintains the first node voltage, wherein the first mode and the second mode have time sections that are different in duration from each other, and wherein a section according to the first mode is longer than a section according to the second mode.

* * * * *